United States Patent [19]
Fukui et al.

[11] Patent Number: 5,696,374
[45] Date of Patent: Dec. 9, 1997

[54] OPTICAL ENCODER USING DOUBLED DIFFRACTION ANGLE BASED ON FIRST AND SECOND DIFFRACTION GRATINGS

[75] Inventors: Atsushi Fukui; Kanji Nishii, both of Osaka; Kenji Takamoto, Neyagawa; Masami Ito, Moriguchi, all of Japan

[73] Assignee: Matsushita Electric Industrial Co., Ltd., Kadoma, Japan

[21] Appl. No.: 711,598

[22] Filed: Sep. 10, 1996

Related U.S. Application Data

[62] Division of Ser. No. 504,708, Jul. 20, 1995.

[30] Foreign Application Priority Data

Jul. 28, 1994 [JP] Japan ................................ 6-176848

[51] Int. Cl.$^6$ ................................................. G01B 9/02
[52] U.S. Cl. ......................................... 250/237 G; 356/356
[58] Field of Search ............................. 250/237 G, 548; 356/356, 395; 33/707

[56] References Cited

U.S. PATENT DOCUMENTS

| | | | |
|---|---|---|---|
| 4,200,395 | 4/1980 | Smith et al. | 356/356 |
| 4,338,012 | 7/1982 | Matsumura et al. | 354/200 |
| 4,656,347 | 4/1987 | Une et al. | 250/237 G |
| 5,196,711 | 3/1993 | Matsugu et al. | 250/548 |

FOREIGN PATENT DOCUMENTS

| | | |
|---|---|---|
| 62-204127 | 9/1987 | Japan . |
| 64417 | 1/1989 | Japan . |
| 3-279812 | 12/1991 | Japan . |
| 4-81612 | 3/1992 | Japan . |

*Primary Examiner*—Edward P. Westin
*Assistant Examiner*—Kevin Pyo
*Attorney, Agent, or Firm*—Renner, Otto, Boisselle, Sklar

[57] ABSTRACT

An optical encoder includes: a light source; a first grating plate having a first diffraction grating for diffracting a light beam emitted from the light source; a second grating plate having a second diffraction grating for further diffracting the light beam diffracted by the first diffraction grating; a reflector for reflecting the light beam from the second grating plate so as to allow the light beam to reenter the second grating plate; and a light-receiving portion for receiving the light beam reflected by the reflector and successively diffracted by the second and first grating plates, wherein a diffraction angle of plus and minus first-order diffracted light beams of the first diffraction grating is substantially equal to that of the plus and minus first-order diffracted light beams of the second diffraction grating, and the light-receiving portion generates an electric signal in accordance with the amount of the plus and minus first-order diffracted light beams of the first diffraction grating.

8 Claims, 13 Drawing Sheets

PRIOR ART

OPTICAL ENCODER USING DOUBLED DIFFRACTION ANGLE BASED ON FIRST AND SECOND DIFFRACTION GRATINGS

This is a division of copending application Ser. No. 08/504,708, filed Jul 20, 1995.

BACKGROUND OF THE INVENTION

1. Field of the Invention

The present invention relates to an optical encoder for converting mechanical displacement into an electrical signal.

2. Description of the Related Art

With reference to FIG. 13, a conventional exemplary optical encoder will be described.

FIG. 13 is a schematic diagram showing a conventional optical encoder. A conventional encoder 100 includes: a light source 101; a collimator lens 102; a fixed slit plate 103; a movable slit plate 104; and a light-receiving portion 105. The collimator lens 102 is used for collimating a light beam emitted from the light source 101. After traveling through the collimator lens 102, the light beam enters the slit plates 103 and 104. The fixed slit plate 103 and the movable slit plate 104 respectively have a plurality of slits which are equal in pitch and parallel to each other. The light-receiving portion 105 receives a flux of light passing through the fixed slit plate 103 and the movable slit plate 104, and converts the flux of light into an electric signal.

The light source 101, the collimator lens 102, the movable slit plate 104 and the light-receiving portion 105 are placed within a movable section 106. The movable section 106 moves in a direction parallel to a face of the fixed slit plate 103 on which the slits are formed and vertical to the direction of slits.

Hereinafter, the operation of the conventional optical encoder 100 having the above-mentioned configuration will be described.

After being collimated by the collimator lens 102, the fixed slit plate 103 is irradiated with a light beam emitted from the light source 101. Since the slits on the fixed slit plate 103 and the movable slit plate 104 are equal in pitch and parallel to each other, the light beam entering the movable slit plate 104 is transmitted or shielded depending on the relative position of the slits. Since the movable slit plate 104 is placed on the movable section 106 which moves in a direction parallel to the slit of the fixed slit plate 103, the amount of light going out from the movable slit plate 104 changes depending on the displacement of the movable section 106. The light-receiving portion 105, which is placed so as to face the side of the movable slit plate 104 from which the light beam goes out, converts the change in the amount of light into an electric signal, thereby detecting the amount of displacement of the movable section 106.

In the conventional optical encoder 100 thus configured, the slit pitch should be reduced in order to detect the position with higher precision. If the slit pitch is reduced, however, the effect of diffraction is increased, resulting in the reduced change in the amount of transmitted light which occurs due to the displacement of the relative position between the slit plates 103 and 104. As a result, difficulty arises in detecting the signal. The effect of diffraction of light can be reduced by shortening the distance between the slit plates 103 and 104. In this case, however, there arises a problem that the slit plates 103 and 104 are likely to be broken with ease when they are brought into contact with each other due to impact or vibration. For example, assuming that resolution of the positional detection is 5 μm per pulse of the signal, the slit pitch of the slit plates 103 and 104 is 5 μm. In this case, it is necessary to set the distance between the slit plates 103 and 104 to several μm or less in order to obtain sufficient change in the light intensity at the light-receiving portion 105.

It is known that when the slits having a pitch p are irradiated with light using the light source having a small wavelength width and height coherence (having a wavelength of $\lambda$), the dark and bright patterns having the same pitch as the slit pitch which are called Fourier images, are generated at the positions expressed by $m \times (p \times p/\lambda)$ (m is an integer) in the rear of the slit. The use of these Fourier images makes it possible to increase the distance between the slits without decreasing the amount of change in the light intensity at the light-receiving portion 105. In the case where the slit pitch is reduced to 5 μm, however, the distance between the Fourier images is also reduced. For example, assuming that the wavelength of the light source is 780 nm, the Fourier images are generated at intervals of 32 μm from the slit plate 103. If the position of the slit plate 104 deviates from the positions of the Fourier images due to the change in the distance between the slit plates 103 and 104, the amount of the light intensity at the light-receiving portion 105 is reduced. Therefore, the variation in the distance between the slit plates 103 and 104 should be within about 8 μm. Moreover, since the odd-numbered Fourier images and the even-numbered Fourier images have reversed patterns of dark and bright, it is necessary to precisely place the two slit plates 103 and 104 so as to be parallel to each other. In this way, in the conventional optical encoder 100, it is necessary to precisely adjust the arrangement of the two slits 103 and 104.

SUMMARY OF THE INVENTION

The optical encoder of this invention, includes: a light source; a first grating plate having a first diffraction grating for diffracting a light beam emitted from the light source; a second grating plate having a second diffraction grating for further diffracting the light beam diffracted by the first diffraction grating; reflection means for reflecting the light beam from the second grating plate so as to allow the light beam to reenter the second grating plate; and a light-receiving portion for receiving the light beam reflected by the reflection means and successively diffracted by the second and first grating plates, wherein a diffraction angle of plus and minus mth-order diffracted light beams of the first diffraction grating is substantially equal to that of the plus and minus mth-order diffracted light beams of the second diffraction grating, where m is a positive integer, and the light-receiving portion generates an electric signal in accordance with the amount of the plus and minus mth-order diffracted light beams of the first diffraction grating.

According to one aspect of the invention, the optical encoder includes: a light source; a first grating plate having a first diffraction grating for diffracting a light beam emitted from the light source; a second grating plate having a second diffraction grating for further diffracting the light beam diffracted by the first diffraction grating so as to allow the light beam to be incident on the grating plate; and a light-receiving portion for receiving the light beam from the first grating plates, wherein a diffraction angle of plus and minus mth-order diffracted light beams of the second diffraction grating is substantially equal to a doubled diffraction angle of the plus and minus mth-order diffracted light beams of the first diffraction grating, where m is a positive integer, and the light-receiving portion generates an electric signal in accordance with the amount of the plus and minus mth-order diffracted light beams of the first diffraction grating.

According to another aspect of the invention, an optical encoder includes: a light source; a first grating plate having a first diffraction grating for diffracting a light beam emitted from the light source; a second grating plate having a second diffraction grating for further diffracting the light beam diffracted by the first diffraction grating so as to allow the light beam to be incident on the grating plate; and a light-receiving portion for receiving the light beam reentering the first grating plate and diffracted by the first grating plates, wherein the second diffraction grating is designed so that the greater part of the diffracted light is concentrated in a diffracted light beam of a predetermined order among the light beams from the first diffraction grating, and the diffracted light beam of the predetermined order travels in a direction in which the light beam is incident on the blazed diffraction grating from the first grating plate, and the light-receiving portion generates an electric signal in accordance with an amount of plus and minus mth-order diffracted light beams of the first diffracted light beams.

An optical encoder of the present invention converts phase change of plus and minus first order diffracted light beams generated due to the displacement of the relative position of a movable plate and a fixed plate into light intensity change by using interference between plus and minus first order diffracted light beams, thereby detecting the obtained light intensity change at the light-receiving portion. Thus, even if grating pitches of the movable plate and the fixed plates are reduced in order to enhance the resolution, a signal whose amplitude is never lowered can be obtained.

Thus, the invention described herein makes possible the advantage of providing an optical encoder capable of detecting the position with high precision and increasing the distance between the plates.

This and other advantages of the present invention will become apparent to those skilled in the art upon reading and understanding the following detailed description with reference to the accompanying figures.

DESCRIPTION OF THE PREFERRED EMBODIMENTS

EXAMPLE 1

Hereinafter, an optical encoder 10 of a first example according to the present invention will be described by way of illustrative examples.

Figure 1A:
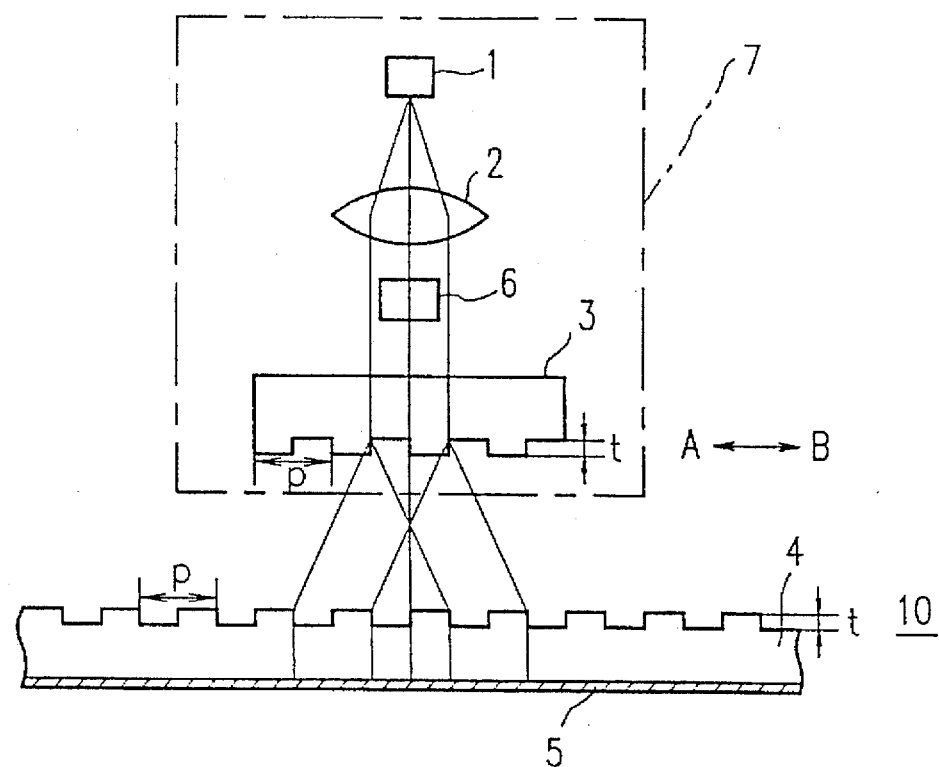
FIGS. 1A and 1B are a front view and a side view, respectively, schematically showing the configuration of an optical encoder of Example 1 according to the present invention.
Figure 1B:
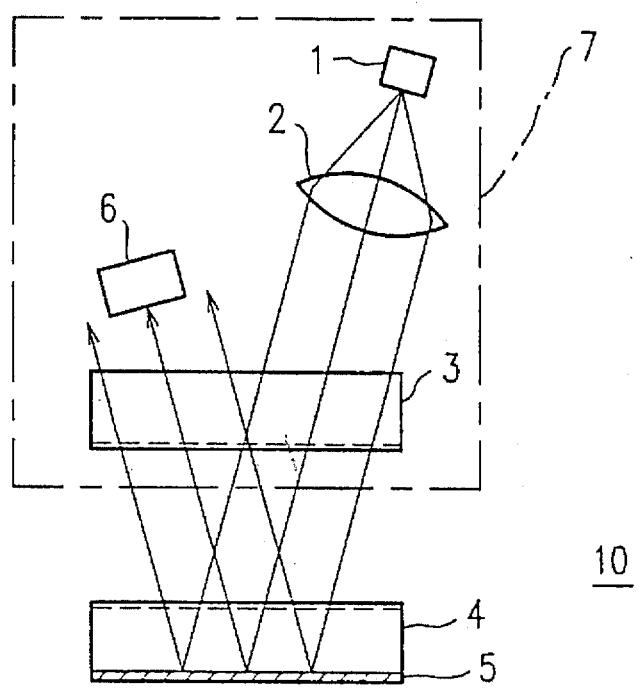

FIGS. 1A and 1B are schematic diagrams of the optical encoder 10 of a first example according to the present invention. Specifically, FIG. 1A is a front view of the optical encoder 10, and FIG. 1B is a side view thereof. A light source 1 is a semiconductor laser, a light-emitting diode having a sufficiently small light-emitting portion or the like. A wavelength of the light emitted from the light source 1 is $\lambda$. A collimator lens 2 collimates a light beam emitted from the light source 1. A movable plate 3 includes a diffraction grating of a rectangular cross-section having a pitch p and a step difference t, which is formed on a transparent substrate having parallel flat surfaces. The light going out from the collimator lens 2 enters the movable plate 3. A fixed plate 4 also includes a diffraction grating of a rectangular cross-section having a pitch p and a step difference t, which is formed on a transparent substrate having parallel flat surfaces. The light going out from the movable plate 3 enters the fixed plate 4. The parallel flat substrates of the movable plate 3 and the fixed plate 4 are made of the same material such as polycarbonate, quartz glass or the like. The step difference t of each of the diffraction gratings of the movable plate 3 and the fixed plate 4 satisfies the following Equation 1:

$$|n-n_o| \times t = (\lambda/2) \times (1+2j) \qquad \text{[Equation 1]}$$

where $j=0, \pm1, \pm2 \ldots$ etc., n is a refractive index of a material of the movable plate 3 and the fixed plate 4, and $n_o$ is a refractive index of a medium between the movable plate 3 and the fixed plate 4. The directions of the grooves of the diffraction grating of the movable plate 3 are parallel to those of the fixed plate 4.

A reflective film 5 is formed on the surface of the fixed plate 4 opposite to the surface on which the diffraction grating is formed. The light reflected from the reflective film 5 is successively rediffracted through the fixed plate 4 and the movable plate 3. A light-receiving section 6 receives the light rediffracted by the fixed plate 4 and the movable plate 3 and the fixed plate 4 so as to output an electric signal in accordance with the amount of received light. The light source 1, the collimator lens 2, the movable plate 3 and the light-receiving portion 6 are placed in a movable section 7 which moves in a direction A-B shown in FIG. 1A. The optical axis of the light going out from the collimator lens 2 is slightly inclined with respect to a normal direction of the surface of the fixed plate 4 on which the reflective film 5 is formed, so that the flux of light incident on the reflective film 5 from the light source 1 can be separated from that reaching the light-receiving portion 6 from the reflective film 5.

Regarding the optical encoder 10 thus configured, the operation thereof will be described.

First, it will be described that two fluxes respectively diffracted by the movable plate 3 and the fixed plate 4 overlap each other regardless of the distance between the movable plate 3 and the fixed plate 4, and that the interference intensity of the two fluxes of light changes depending on the displacement of the relative position of the movable plate 3 and the fixed plate 4. Specifically, even if the grating pitch of the diffraction gratings of the movable plate 3 and the fixed plate 4 is reduced, a high signal amplitude can be obtained regardless of the distance between the movable plate 3 and the fixed plate 4, thereby achieving high resolution of the optical encoder.

Figure 2A:
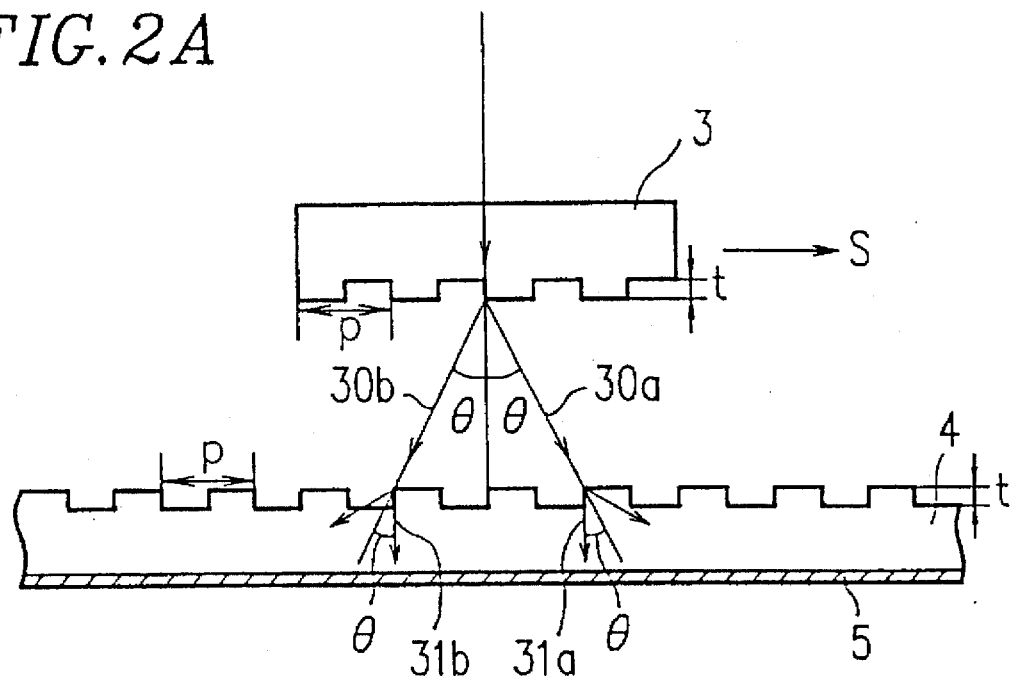
FIGS. 2A and 2B are diagrams showing optical paths to a movable plate and a fixed plate in the optical encoder shown in FIGS. 1A and 1B.
Figure 2B:
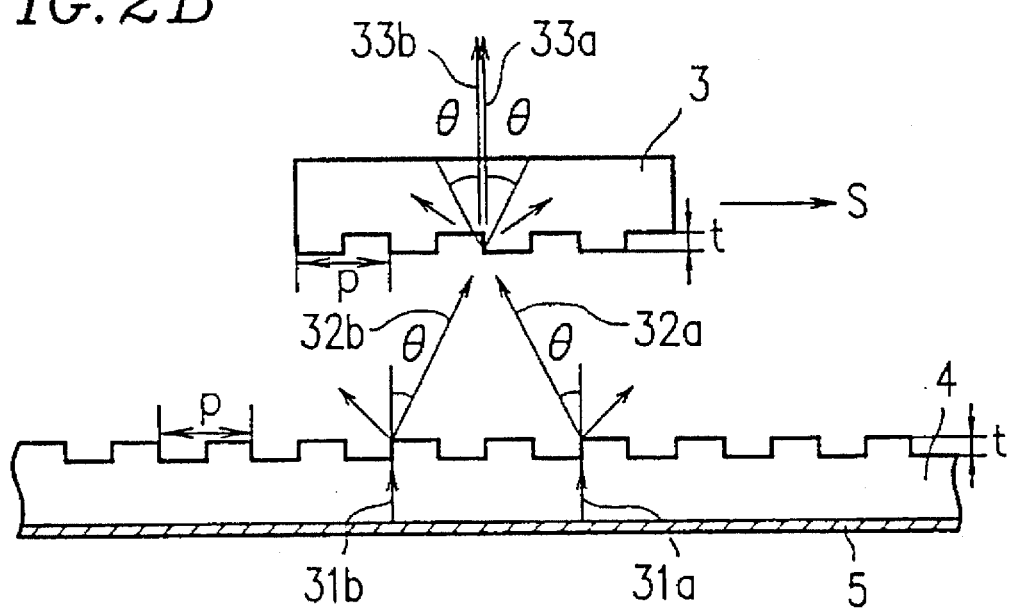

First, an optical path of the diffracted light in the optical encoder 10 will be described. FIG. 2A shows an optical path from the movable plate 3 to the reflective film 5 provided for the bottom face of the fixed plate 4, and FIG. 2B shows an optical path from the reflective film 5 to the movable plate 3.

A light beam emitted from the light source 1 is collimated by the collimator lens 2 so as to enter the movable plate 3. It is well known that the greater part of the amount of light is concentrated in the plus and minus first-order diffracted light beams (about 40% for each) when the step difference t of the diffraction grating of the movable plate 3 and the fixed plate 4 satisfies the above Equation 1. Therefore, the light beams going out from the movable plate 3 are a plus first-order diffracted light beam 30a and a minus first-order diffracted light beam 30b. The fluxes of light 30a and 30b enter the fixed plate 4, and are respectively diffracted by the diffraction grating of the fixed plate 4. As a result, the fluxes of light going out from the fixed plate 4 become plus and minus first-order diffracted light beams. Since the pitch p of the movable plate 3 and the fixed plate 4 are equal to each other, the diffraction angles of plus and minus first-order diffracted light beams are equal to each other. Therefore, as shown in FIG. 2A, a minus first-order diffracted light beam 31a of the flux of light 30a and a plus first-order diffracted light 31b of the flux of light 30b are rendered parallel to each other.

Subsequently, after being reflected by the reflective film 5, the fluxes of light 31a and 31b are diffracted by the diffraction grating of the fixed plate 4. The plus first-order diffracted light beam of the light flux 31a and the minus first-order diffracted light beam of the light flux 31b become fluxes 32a and 32b, respectively. Then, the light fluxes 32a and 32b are diffracted by the movable plate 3, so that the minus first-order diffracted light beam of the light flux 32a and the plus first-order diffracted light beam of the light flux 32b become fluxes 33a and 33b, respectively. Since the diffraction angles of the movable plate 3 and the fixed plate 4 are equal to each other, the light fluxes 33a and 33b are parallel to each other and overlap each other without being affected by the distance between the movable plate 3 and the fixed plate 4.

Next, the change in light intensity due to interference of the diffracted light beams will be described. When the diffraction grating having a grating pitch of p, whose major diffraction light beams are plus and minus first-order diffracted light beams, that is, the diffraction grating is such that the greater part of the diffracted light is concentrated in plus and minus first-order diffracted light beams, displaces in a direction parallel to the grating face and perpendicular to the grooves of the grating by a distance s; the phase of the diffracted light in a displacement direction of the diffraction grating and the phase of the diffracted light in a direction opposite to the displacement direction change by $2\pi s/p$ and $-2\pi s/p$, respectively. Therefore, when the movable section 7 moves in a direction, for example, a right-hand direction indicated with arrows in FIGS. 2A and 2B, by a distance s, the fluxes of light 31a and 31b are subject to phase changes of $2\pi s/p$ and $-2\pi s/p$, respectively. Likewise, since the light fluxes 33a and 33b are also subjected to phase changes, the phase changes in the light fluxes 33a and 33b become $4\pi s/p$ and $-4\pi s/p$, respectively. Assuming that the amplitude of the light fluxes 33a and 33b is 1, the light intensity at the light-receiving portion 6 is obtained as the following Equation 2.

$$|\exp(-4\pi is/p) + \exp(4\pi is/p)|^2 = 2\{\cos(8\pi s/p) + 1\}$$ [Equation 2]

where i is an imaginary unit, and $i \times i = -1$.

The above Equation 2 shows that change in relative position of the movable plate 3 and the fixed plate 4 by 1 pitch provides signals of 4 pulses. The above mentioned interference of the diffracted light beams is not affected by the distance between the movable plate 3 and the fixed plate 4. Therefore, since the distance between the movable plate 3 and the fixed plate 4 can be increased even when the grating pitch is reduced, it is possible to provide high resolution for the optical encoder.

Figure 13:
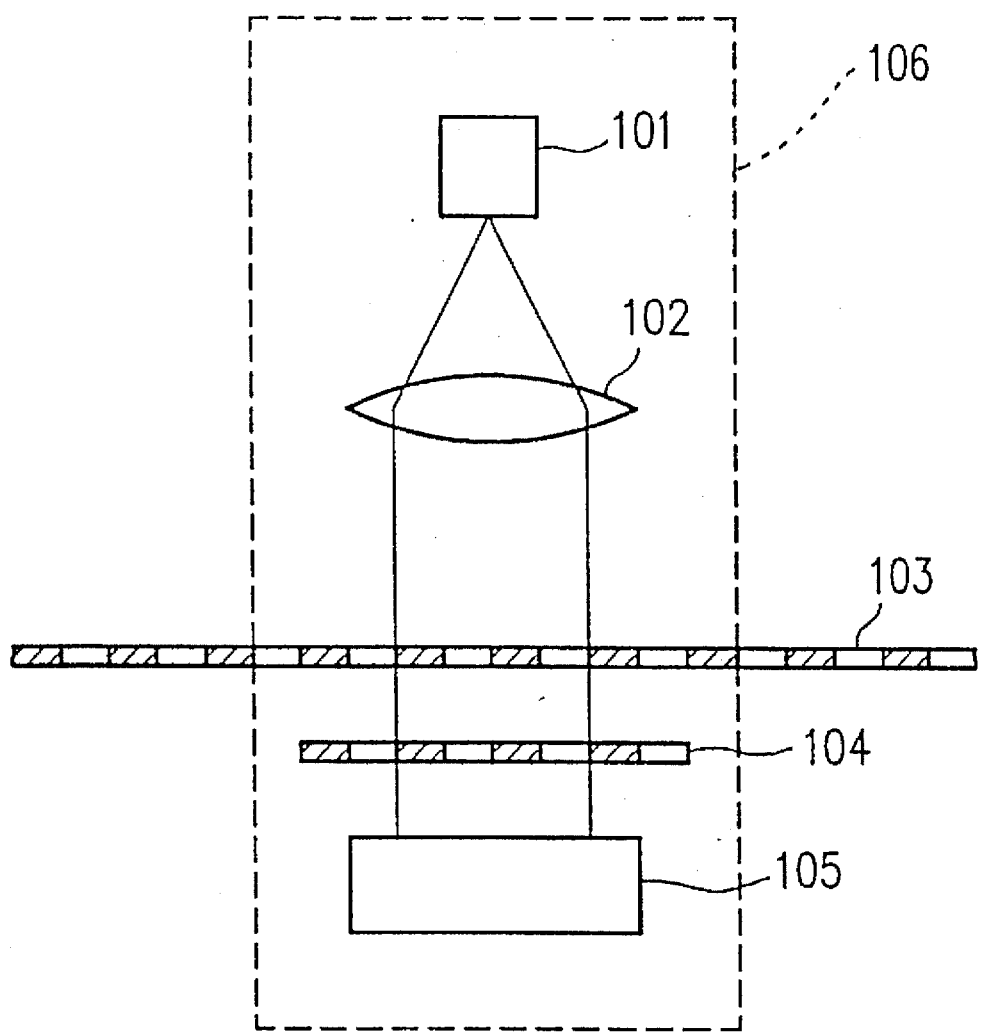
FIG. 13 is a schematic diagram showing a conventional optical encoder.

For example, in the conventional optical encoder 100 shown in FIG. 13, the pitch can be practically reduced to about 50 μm at most taking the distance between the slit plates and the like into consideration. Moreover, when the relative position of the slit plates changes by 1 pitch, only a signal for 1 pulse can be obtained. On the other hand, in the optical encoder 10 of Example 1, the pitches of the diffraction gratings of the movable plate 3 and the fixed plate 4 can be reduced to about p=1 μm, respectively. In this case, the signal for 1 pulse can be obtained with the displacement in the relative position of the movable plate 3 and the fixed plate 4 by 0.25 μm. Therefore, the optical encoder 10 of Example 1 may have about 200 times the resolution of the conventional optical encoder 100.

Figure 3:
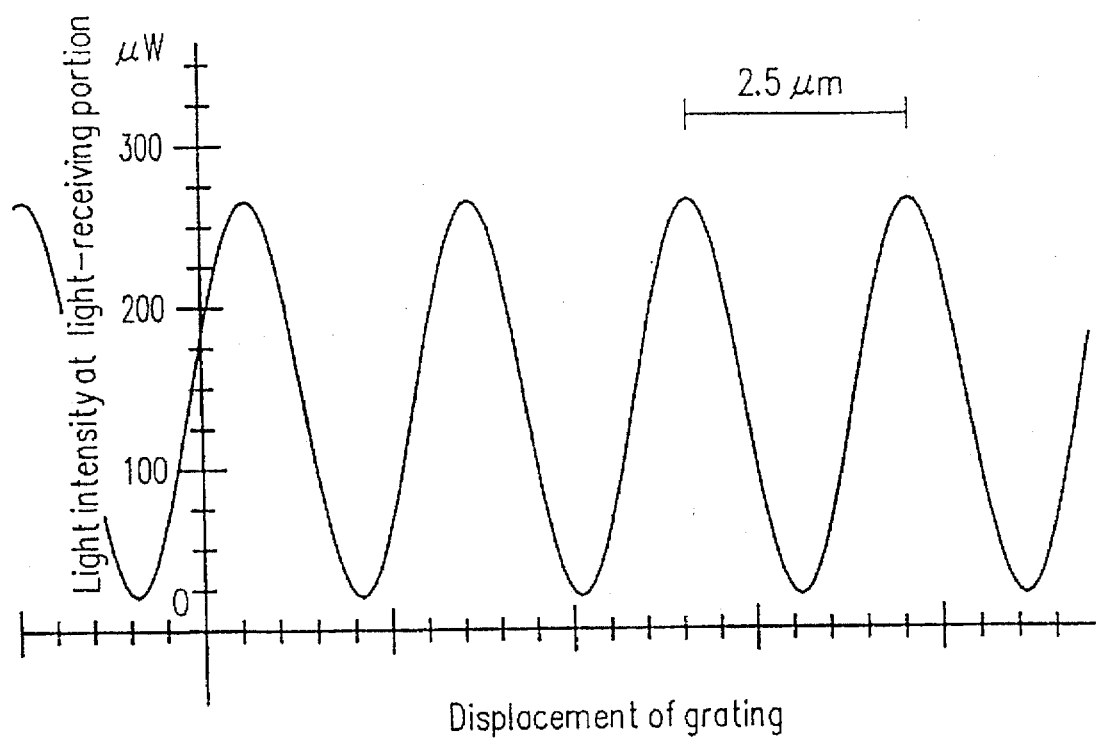
FIG. 3 shows an exemplary waveform of an output signal of the optical encoder shown in FIGS. 1A and 1B.

FIG. 3 shows an exemplary waveform of an output signal from the light-receiving portion 6 of the optical encoder 10 of Example 1. The diffraction gratings having a pitch p of 10 μm and a step difference t of 0.7 μm are used as the diffraction gratings of the movable plate 3 and the fixed plate 4. Quartz glass having a refractive index n=1.45 is used as a material of the movable plate 3 and the fixed plate 4, and an He-Ne laser having a wavelength λ of 633 nm is used as the light source 1. When the relative position of the diffraction gratings of the movable plate 3 and the fixed plate 4 displaces by 2.5 μm, a signal for 1 pulse is obtained.

As described above, the optical encoder 10 of Example 1 converts the phase change of the diffracted light due to displacement of the relative position between the diffraction gratings into the change in the amount of light due to interference using the movable plate and the fixed plate having the same pitch and the diffraction gratings whose major diffracted light beams are plus and minus first-order diffracted light beams so as to detect the change in the amount of light. Thus, even when the distance between the movable plate and the fixed plate is increased, the amplitude of the signal is not lowered. Therefore, since the distance between the movable plate and the fixed plate can be set freely, the movable plate and the fixed plate are prevented from being damaged due to contact therebetween and the degree of freedom of measurement can be increased.

Moreover, since there is no limitation of the distance between the movable plate and the fixed plate when using a Fourier image, unlike the conventional optical encoder, fluctuation in the output of the light-receiving portion with the distance between the movable plate and the fixed plate is narrow. As a result, it is not necessary to precisely align the two plates.

Since the light source, the light-receiving portion and the movable plate are placed on the movable section, the light-receiving portion is hardly displaced even when the movable section is inclined. Thus, it is possible to reduce the area of the light-receiving portion so as to improve a response speed.

The movable and fixed plates are easily duplicated from a stamper. Therefore, it is possible to reduce the cost of the optical encoder.

Although the diffraction gratings of the fixed plate and the movable plate have a rectangular cross-section in Example 1, the diffraction gratings can have a sine wave cross-section or a triangular cross-section.

Although the diffraction grating on the movable plate is provided for the surface facing the fixed plate, the diffraction grating can be provided for the surface facing the light source.

In Example 1, the optical axis of the light source is inclined in order to separate the light beam entering the fixed plate and the light beam going out from the fixed plate. In actuality, however, if the optical axis of the light source 1 is inclined at an angle in the range of about 10° to 20°, the light beams can be sufficiently separated. An optical device for separating light beams can be used instead of inclining the optical axis. A half mirror can be used as the optical device. Alternatively, the light beam entering the fixed plate and the light beam going out from the fixed plate are separated from each other by using a polarized light beam splitter and a quarter-wave plate. In such a case, the direction of the optical axis of the quarter-wave plate is at an angle of 45° with the direction in which the maximum amount of transmitted light is obtained when linearly polarized light enters the beam splitter.

Although the movable section is displaced and the fixed plate is fixed in Example 1, the fixed plate may be displaced and the movable section may be fixed. Moreover, although the movable plate is fixed to the movable section in Example 1, it is not necessary to fix the movable plate to the movable section so long as the displacement of the relative position of the movable plate and the fixed plate can be measured.

Although the reflective film is formed on the bottom face of the fixed plate in Example 1, a reflective mirror may be provided on the movable section so that the flux going out from the fixed plate is reflected back to the fixed plate.

EXAMPLE 2

Figure 4A:
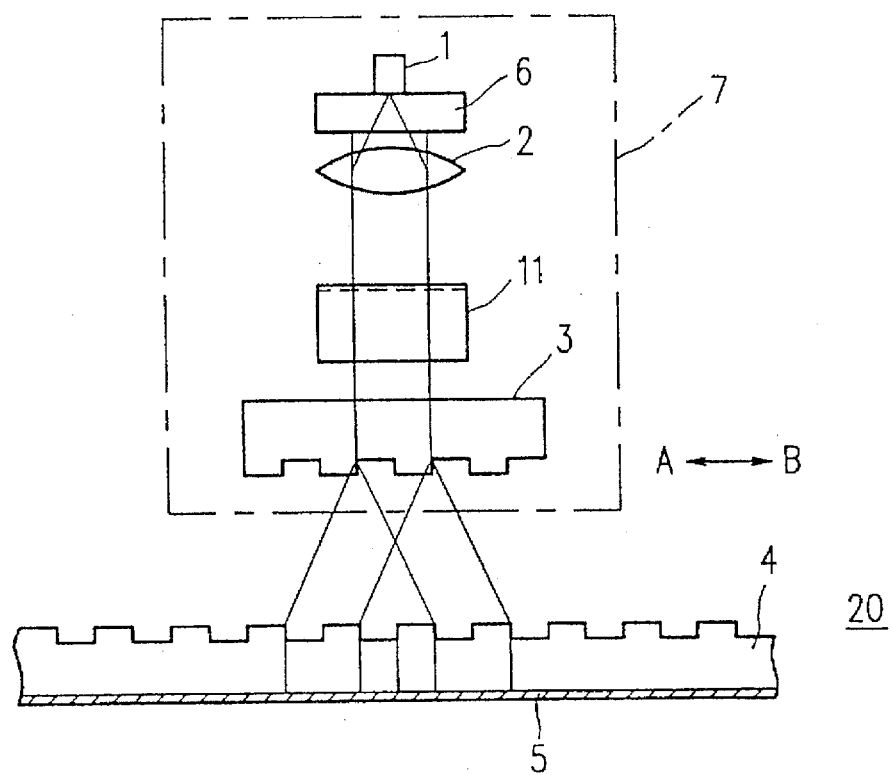
FIGS. 4A and 4B are a front view and a side view, respectively, schematically showing the configuration of an optical encoder of Example 2 according to the present invention.
Figure 4B:
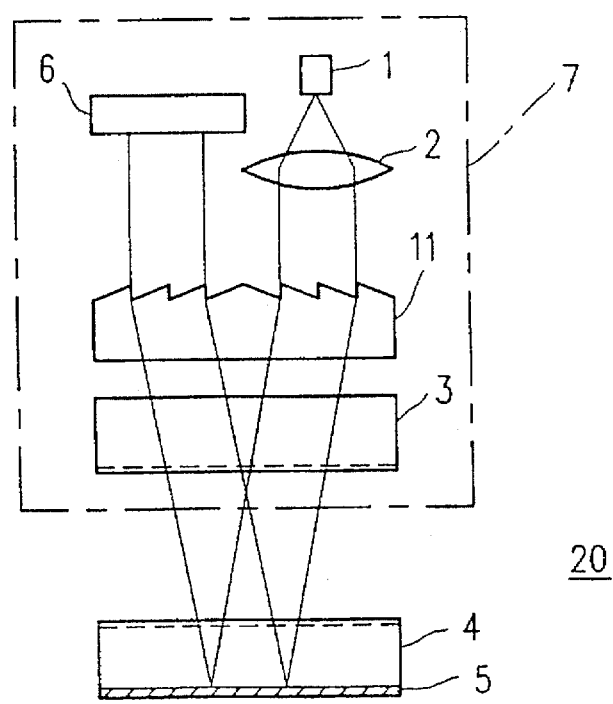

Hereinafter, an optical encoder of Example 2 of the present invention will be described with reference to FIGS. 4A and 4B.

Example 2 differs from Example 1 in a method for separating the light beam entering the fixed plate and the light beam going out from the fixed plate. In Example 1, the light beam entering the fixed plate and the light beam going out from the fixed plate are separated from each other by inclining the optical axis of the light beam entering the fixed plate from the light source with respect to the normal direction of the reflective film. In Example 2, however, the fluxes of light are separated using a diffraction grating 11. FIG. 4A is a front view of an optical encoder 20 of Example 2, and FIG. 4B is a side view thereof. The same components as those shown in FIGS. 1A and 1B are denoted by the same reference numerals. A diffraction grating 11 is a transmissive blazed diffraction grating for concentrating the greater part of the diffracted light in a minus first-order diffracted light beam with respect to the light emitted from the light source 1 and in a plus first-order diffracted light beam with respect to the light going out from the fixed plate 4. The diffraction grating 11 is placed so that the grating face is parallel to the movable plate 3, the fixed plate 4 and the reflective film 5. The grooves of the diffraction grating 11 are formed perpendicularly to the direction of the grooves of the diffraction gratings of the movable plate 3 and the fixed plate 4.

The operation of the optical encoder 20 of Example 2 is the same as that of the optical encoder 10 of Example 1 except that the light beam emitted from the light source 1 and the light beam going out from the movable plate 3 respectively enter the movable plate 3 and the light-receiving portion 6 after being diffracted by the diffraction grating 11. Specifically, also in the optical encoder 20 of Example 2, the amount of light received by the light-receiving portion 6 changes depending on the relative position of the movable plate 3 and the fixed plate 4 regardless of the distance between the movable plate 3 and the fixed plate 4. Thus, when the relative position of the movable plate 3 and the fixed plate 4 changes by one pitch, the signal of 4 pulses can be obtained. Therefore, it is possible to enhance the resolution of the optical encoder 20 of Example 2 as compared with an optical encoder such as the conventional optical encoder 100 shown in FIG. 13 in which only a signal of 1 pulse is obtained when the relative position of the movable plate 3 and the fixed plate 4 changes by 1 pitch.

Furthermore, since the distance between the movable plate 3 and the fixed plate 4 does not affect the change in the amount of light received by the light-receiving portion 6, the distance between the movable plate 3 and the fixed plate 4 can be increased. Accordingly, the grating pitch of the diffraction gratings of the movable plate 3 and the fixed plate 4 can be respectively reduced. With the reduced pitch, it is possible to further enhance the resolution of the optical encoder.

Next, the separation of the light beams entering and going out from the fixed plate 4 by means of the diffraction grating 11 will be described. The light beam emitted from the light source 1 is collimated through the collimator lens 2 and is incident on the diffraction grating 11 perpendicularly to the grating face thereof. The light beam going out from the collimator lens 2 is diffracted by the diffraction grating 11. The diffraction grating 11 is a transmissive blazed diffraction grating with which the greater part of the diffracted light beam is concentrated in the minus first-order diffracted light beam. Assuming that an angle of diffraction of the diffraction grating 11 is $\theta_1$, the minus first order diffracted light beam from the diffraction grating 11 is incident on the reflective film 5 at an angle of $\theta_1$ with the normal direction of the reflective film 5 after being diffracted by the movable plate 3 and the fixed plate 4. After passing through the fixed plate 4 and the movable plate 3, the light beam reflected by the reflection film 5 is diffracted by the diffraction grating 11 again. As a result, the minus first-order diffracted light beam reaches the light-receiving portion 6. Assuming that the distance from the diffraction grating 11 to the reflection film 5 is $\alpha$, the light beam entering the fixed plate 4 can be separated from the light beam going out from the fixed plate 4 by the distance $2\alpha \times \tan \theta_1$. As a result, the light beam going out from the fixed plate 4 can be detected at the light-receiving portion 6.

As described above, according to Example 2, in addition to the enhanced resolution of the optical encoder as in Example 1, the use of the diffraction gratings makes it possible to separate the light beams entering and going out from the movable plate and the fixed plate respectively without inclining the optical axis of the light beam emitted from the light source.

Also in Example 2, the diffraction gratings can have a sine wave cross-section or a triangular cross-section. Moreover, the diffraction grating on the movable plate may be provided for the surface facing the diffraction grating for separating the fluxes of light.

Also in Example 2, the movable section or the fixed plate can be moved and it is not necessary to fix the movable plate to the movable section so long as the displacement of the relative position of the movable plate and the fixed plate can be measured.

A reflective mirror can be provided on the movable section instead of providing the reflective film on the back face of the fixed plate so that the flux of light going out from the fixed plate enters the fixed plate again.

EXAMPLE 3

Hereinafter, an optical encoder 30 of Example 3 according to the present invention will be described with reference to FIG. 5. The configuration of the Example 1 differs from that of Example 3 in the following point. While the diffraction gratings of both the fixed plate and the movable plate are transmissive in Example 1 and the reflective film is provided for the bottom face of the fixed plate in Example 1, the diffraction grating of the fixed plate and the diffraction grating of the movable plate are respectively reflective and transmissive and the reflective film is provided on the bottom face of the movable plate. The same components as those shown in FIG. 1 are denoted by the same reference numerals.

Figure 5:
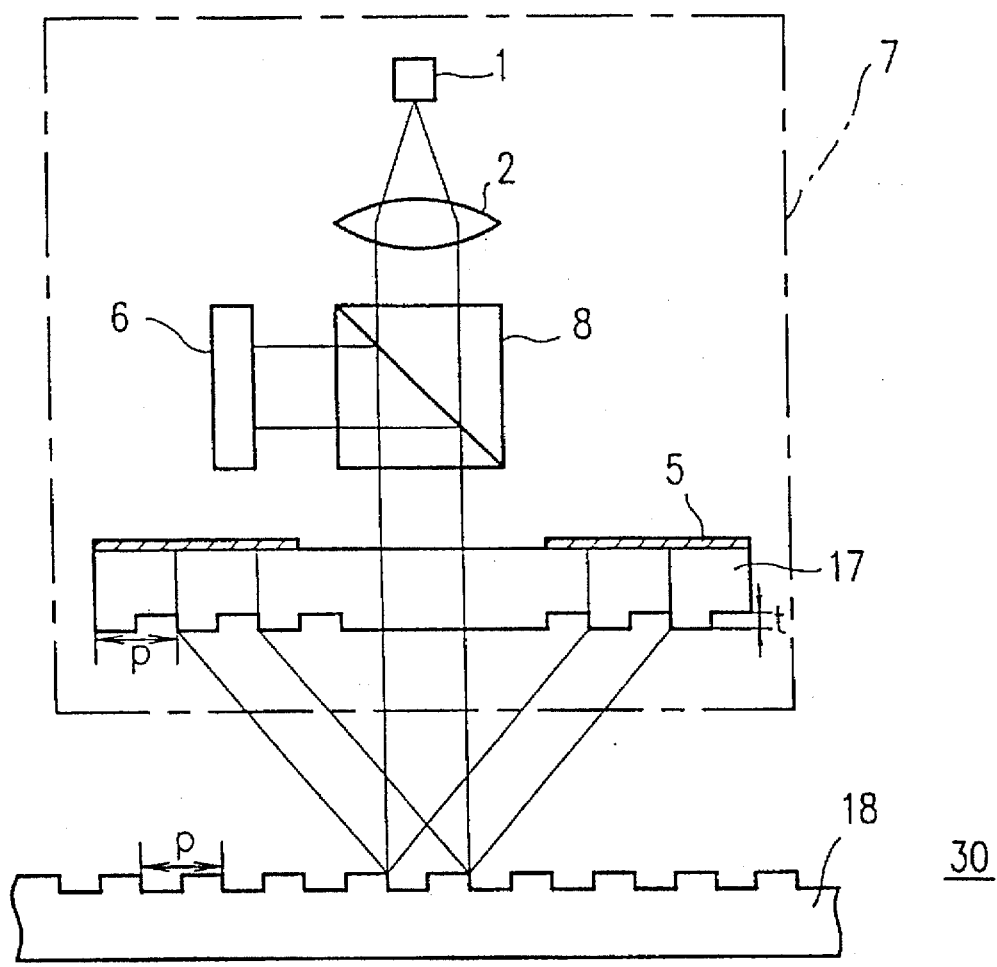
FIG. 5 is a schematic diagram showing an optical encoder of Example 3 according to the present invention.

An optical encoder 30 of FIG. 5 has the light source 1, the collimator lens 2, a movable plate 17, the reflective film 5, a half mirror 8 and the light-receiving portion 6, which are included in the movable section 7, and a fixed plate 18. The half mirror 8 separates a light beam entering the fixed plate 18 from a light beam going out from the fixed plate 18. The fixed plate 18 includes the reflective diffraction grating of a rectangular cross-section having a pitch p and a step difference $(\lambda/2) \times (1+2j)/n_0$ of the grating is formed thereon, where $j=0, 1, 2 \ldots$ etc., and $n_0$ is a refractive index of a medium between the fixed plate 18 and the movable plate 17. The movable plate 17 includes a diffraction grating of a rectangular cross-section having a pitch p and a step difference t of the grating satisfying Equation 1 described above, which is formed on one of parallel flat surfaces of the transparent substrate. The reflective film 5 is formed on the face of the movable plate 17, which is opposite to the face facing the fixed plate 18. In the movable plate 17, however, neither diffraction grating nor reflective film 5 is formed on the portion through which the light beam going out from the collimator lens 2 passes. The size of the portion of the movable plate 17 on which the diffraction grating and the reflective film 5 are formed is set taking the diameter of light into consideration.

The operation of the optical encoder 30 having the configuration shown in FIG. 5 will be described. The light beam emitted from the light source 1 is collimated by the collimator lens 2, passes though the half mirror 8, transmits through the movable plate 17, and is diffracted by the diffraction grating of the fixed plate 18. The diffraction grating of the fixed plate 18 is formed so that the greater part of the diffracted light is concentrated in plus and minus first-order diffracted light beams. Therefore, the plus and minus first-order diffracted light beams enter the movable plate 17 as light beams going out from the fixed plate 18. After being reflected by the reflective film 5, the light beams diffracted by the diffraction grating of the movable plate 17 is diffracted again by the diffraction grating of the movable plate 17. The movable plate 17 is also configured so that major diffracted light beams can be plus and minus first-order diffracted light beams. The light beam going out from the movable plate 17 is diffracted by the diffraction grating of the fixed plate 18 so as to enter the half mirror 8. The half mirror 8 reflects the light beam diffracted by the fixed plate 18 so that the light beam enters the light-receiving portion 6. Since the main diffracted light beams of the diffraction grating of the fixed plate 18 are the plus and minus first-order diffracted light beams as described above, the light-receiving portion 6 receives the plus and minus first-order diffracted light beams alone.

The change in the interference intensity of the diffracted light beams due to displacement of the relative position of the fixed plate 18 and the movable plate 17 is the same as that in Example 1. Specifically, since the diffraction gratings of the fixed plate 18 and the movable plate 17 are equal in pitch, the interference between two fluxes of light occurs due to the four-fold diffraction by the fixed plate 18 and the movable plate 17. Moveover, when the relative position of the fixed plate 18 and the movable plate 17 displaces by s, the phase change of $\pm 4\pi s/p$ occurs between the diffracted light beams. As a result, the change in the interference intensity at the light-receiving portion 6 is $2\{\cos(8\pi s/p)+1\}$. Therefore, when the relative position of the movable plate 17 and the fixed plate 18 changes by 1 pitch of the grating, a signal for 4 pulses can be obtained. The interference between the diffracted light beams are not affected by change in the distance between the movable plate 17 and the fixed plate 18.

As described above, according to Example 3, high resolution can be obtained as compared with the conventional optical encoder 100 with which a signal of 1 pulse is obtained for the displacement of the relative position of the movable plate and fixed plate by one pitch. Since the change in the amount of diffracted light beams due to interference between the diffracted light beams, which is detected at the light-receiving portion 6, is not affected by the distance between the movable plate 17 and the fixed plate 18, the distance between the movable plate 17 and the fixed plate 18 can be increased even when the grating pitch is reduced. Thus, it is possible to provide the optical encoder with higher resolution.

As described above, according to the present example, the diffraction gratings of the fixed plate and the movable plate are reflective and transmissive, respectively, and the reflective film is provided on the face of the movable plate, which is opposite to the face on which the diffraction grating is formed, thereby obtaining the same effects as those of Example 1.

Since the light source, the light-receiving portion and the movable plate are placed on the movable section, the light-receiving portion is hardly displaced even when the movable section is inclined. Thus, it is possible to reduce the area of the light-receiving portion so as to improve a response speed.

Although the diffraction gratings of the fixed plate and the movable plate have a rectangular cross-section in Example 3, the diffraction gratings can have a sine wave cross-section or a triangular cross-section.

Although the diffraction grating on the fixed plate is provided on the surface facing the movable plate, the diffraction grating can be formed on the surface opposite to the surface facing the movable plate.

Although the light beam entering the fixed plate and the light beams going out from the fixed plate are separated from each other by using the half mirror in Example 3, the separation can be achieved by inclining the optical axis of the light source with respect to the normal direction of the reflective film instead as in Example 1. Alternatively, a diffraction grating of light can be used as described above in Example 2. Alternatively, the light beam entering the fixed plate from the light source and the light beams going out from the fixed plate can be separated from each other using a polarized light beam splitter and a quarter-wave plate. The direction of the optical axis of the quarter-wave plate is at an angle of 45° with the direction in which the amount of transmitted light becomes maximum when the linearly polarized light enters the polarized light beam splitter.

Although the movable section moves and the fixed plate is fixed in Example 3, the fixed plate can be moved and the movable section can be fixed instead.

Although the movable plate is fixed to the movable section in Example 3, the movable plate is not necessarily fixed to the movable section. In short, as long as the displacement of the relative position between the movable plate and the fixed plate can be measured, it does not matter whether the movable plate is fixed to the movable section or not.

Although the reflective film is provided for the bottom face of the movable plate, a mirror can be provided on the movable section instead of the reflective film so that the flux of light returns to the movable plate.

EXAMPLE 4

Hereinafter, an optical encoder 40 of Example 4 according to the present invention will be described with reference to FIG. 6. The configuration of the Example 4 differs from that of Example 1 in the following point. While the diffraction gratings of both the fixed plate and the movable plate are transmissive in Example 1 and a reflective film is provided for the bottom face of the fixed plate in Example 1, the diffraction grating of the fixed plate and the diffraction grating of the movable plate are transmissive and reflective, respectively. Unlike Examples 1 to 3 described above, a reflective film is not used in Example 4 and a pitch of the diffraction grating of the movable plate is double that of the diffraction grating of the fixed plate. The same components as those shown in FIG. 1 are denoted by the same reference numerals.

Figure 6:
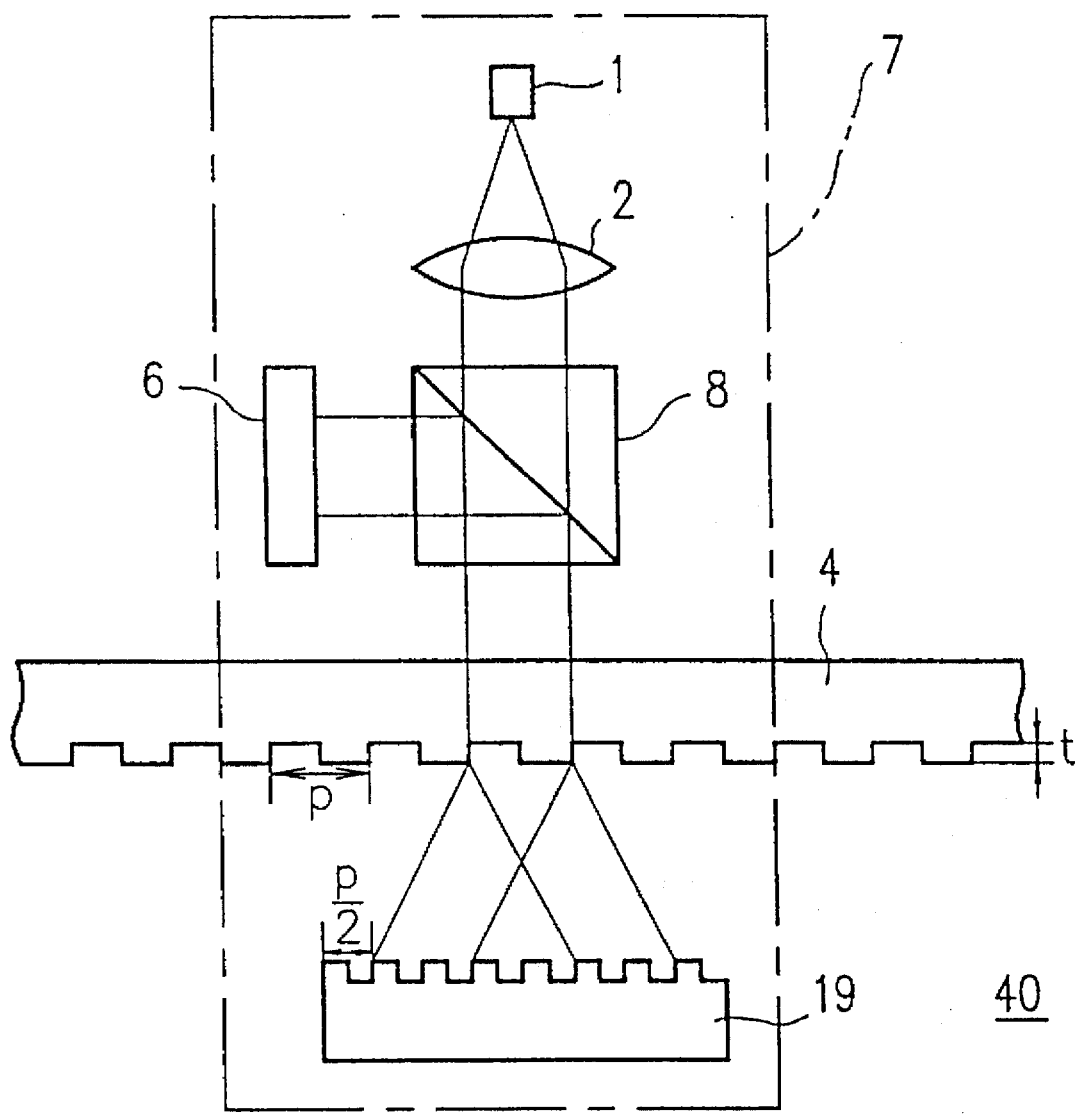
FIG. 6 is a schematic diagram showing an optical encoder of Example 4 according to the present invention.

An optical encoder 40 of FIG. 6 has the light source 1, the collimator lens 2, a movable plate 19, the half mirror 8 and the light-receiving portion 6, which are all included in the movable section 7, and the fixed plate 4. The fixed plate 4 is a transparent flat substrate similar to that used in Example 1, on one surface of which the diffraction grating of a rectangular cross-section having a pitch p and a step difference t of the grating satisfying the above Equation 1 is formed. The movable plate 19 is a flat substrate having two surfaces parallel to each other, on one surface of which the reflective diffraction grating of a rectangular cross-section having a pitch p/2 and a step difference of $(\lambda/2)\times(1+2j)/n_0$ is formed, where $j=0, 1, 2 \ldots$ etc., and $n_0$ is a refractive index of a medium between the fixed plate 4 and the movable plate 19. Specifically, both of the diffraction grating of the fixed plate 4 and the diffraction grating of the movable plate 19 are designed so that the main diffracted light beams thereof are plus and minus first-order diffracted light beams. In Example 4, the diffraction grating is formed on the face (surface) of the movable plate 19 facing the fixed plate 4.

The operation of the optical encoder 40 having the structure shown in FIG. 6 will be described. The light beam emitted from the light source 1 is collimated by the collimator lens 2, passes though the half mirror 8, and enters the fixed plate 4. Since the diffraction grating of the fixed plate 4 is formed so that the greater part of the diffracted light is concentrated in the plus and minus first-order diffracted light beams, the plus and minus first-order diffracted light beams enter the movable plate 19 as light beams going out from the fixed plate 4. The light beams going out from the fixed plate 4 are diffracted by the diffraction grating on the surface of the movable plate 19, and further diffracted by the fixed plate 4. The plus and minus first-order diffracted light beams going out from the fixed plate 4 are reflected by the half mirror 8, and enter the light-receiving portion 6.

The change in the interference intensity of the diffracted light beam due to displacement of the relative position of the fixed plate 4 and the movable plate 19 will be described. Since the pitch of the diffraction grating of the movable plate 19 is half that of the diffraction grating of the fixed plate 4 in Example 4, diffraction angle of the plus and minus first-order diffracted light beams is double that of the fixed plate 4. Therefore, the light beams diffracted by the movable plate 19 travels in the same direction as that the light beams entering the movable plate 19 travel in. When the diffracted light beams of the movable plate 19 enter the fixed plate 4 and are diffracted, the interference occurs between the two diffracted light beams.

Furthermore, when the relative position of the fixed plate 4 and the movable plate 19 changes by s, the phase change of $\pm 4\pi s/p$ occurs between the two diffracted light beams. Therefore, the intensity change of the interference light beams received at the light-receiving portion 6 is $2\{\cos(8\pi s/p)+1\}$. As a result, a signal for 4 pulses can be obtained by the relative change for 1 pitch of the diffraction grating of the fixed plate 4. Accordingly, the optical encoder 40 has high resolution as compared with the conventional optical encoder 100 shown in FIG. 13. The interference between the diffracted light beams is not affected by the distance between the movable plate 19 and the fixed plate 4. Therefore, even when the grating pitch is reduced in order to further enhance the resolution, the distance between the movable plate 19 and the fixed plate 4 can be increased. As a result, it is possible to provide higher resolution for the optical encoder 40.

As described above, according to Example 4, the fixed plate has a transmissive diffraction grating, the movable plate has a reflective diffraction grating, and furthermore, the pitch of the diffraction grating of the movable plate is half that of the fixed plate. As a result, the same effects as those of Example 1 can be obtained.

Since the light source, the light-receiving portion and the movable plate are placed on the movable section, the light-receiving portion is hardly displaced even when the movable section is inclined. Thus, it is possible to reduce the area of the light-receiving portion so as to improve a response speed.

Although the diffraction gratings of the fixed plate and the movable plate have a rectangular cross-section in Example 3, the diffraction gratings can have a sine wave cross-section or a triangular cross-section.

Although the diffraction grating of the fixed plate is provided on the surface facing the movable plate in Example 4, it can be provided on the surface facing the light source.

Although the light beam entering the fixed plate and the light beams going out from the fixed plate are separated from each other by using the half mirror in Example 4, the separation can instead be achieved by inclining the optical axis of the light source with respect to the normal direction of the reflective film. Alternatively, a diffraction grating of light may be used as described above in Example 2. Alternatively, the light beam entering the fixed plate from the light source and the light beams going out from the fixed plate may be separated from each other using a polarized light beam splitter and a quarter-wave plate. The direction of the optical axis of the quarter-wave plate is at an angle of 45° with the direction in which the amount of transmitted light becomes maximum when the linearly polarized light enters the polarized light beam splitter.

Although the movable section moves and the fixed plate is fixed in Example 4, the fixed plate can be moved and the movable section can be fixed.

Although the movable plate is fixed to the movable section in Example 4, the movable plate is not necessarily fixed to the movable section. In other words, the displacement of the relative position of the movable plate and the fixed plate can be measured instead.

EXAMPLE 5

Hereinafter, an optical encoder of Example 5 according to the present invention will be described with reference to FIG. 7. Example 1 differs from Example 5 in the following point. While the diffraction gratings of both fixed plate and movable plate are both transmissive and a reflective film is provided for the bottom face of the fixed plate in Example 1, the diffraction gratings of the fixed plate and the movable plate are both reflective and the reflective film is omitted in Example 5. Moreover, as in Example 4, the pitch of the diffraction grating of the movable plate is double that of the pitch of the fixed plate. The same components as those in FIGS. 1A, 1B and 5 are denoted by the same reference numerals.

Figure 7:
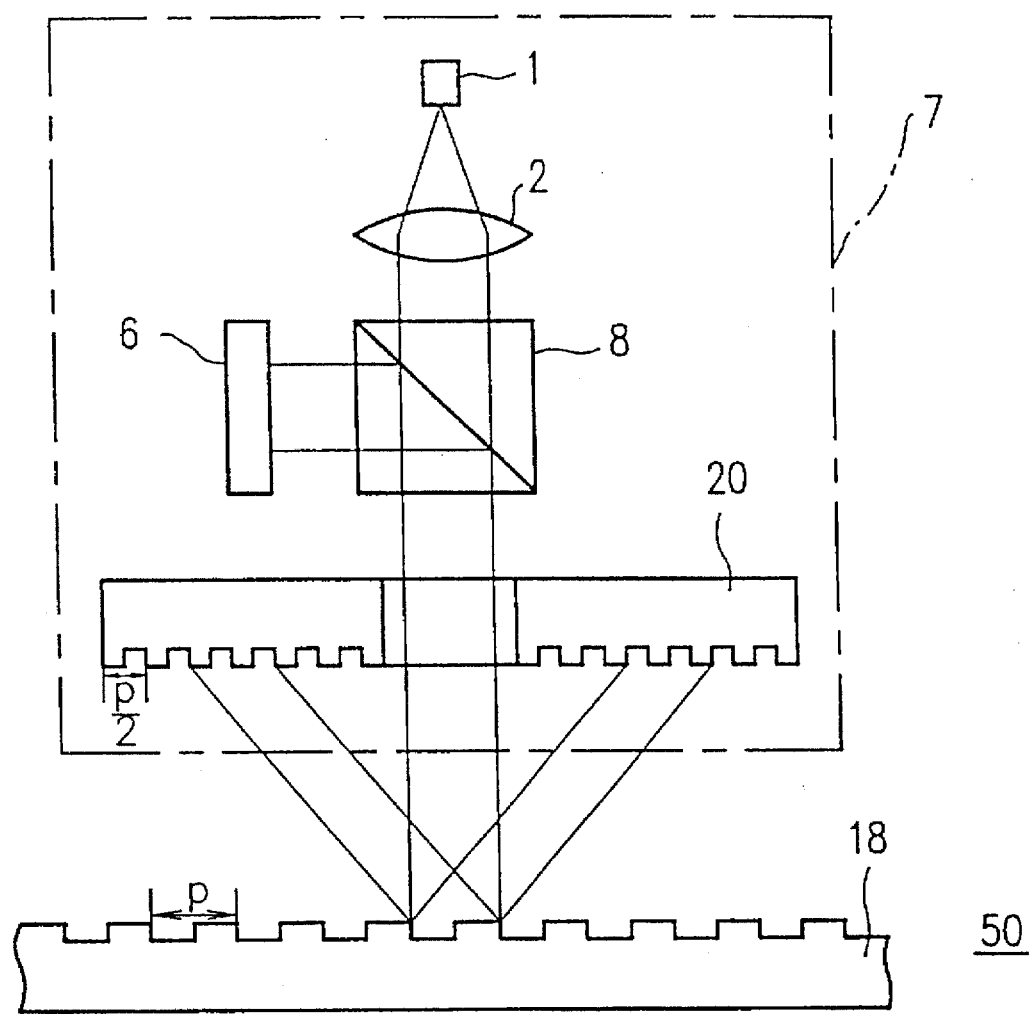
FIG. 7 is a schematic diagram showing an optical encoder of Example 5 according to the present invention.

An optical encoder 50 of FIG. 7 has the light source 1, the collimator lens 2, a movable plate 20, the half mirror 8 and the light-receiving portion 6, which are all included in the movable section 7, and the fixed plate 18. The fixed plate 18 has a substrate having parallel flat surfaces; on one of which is formed a reflective diffraction grating having a pitch p and a step difference $(\lambda/2) \times (1+2j)/n_0$, where j=0, 1, 2, ... and so forth, so that the greater part of the diffracted light is concentrated in plus and minus first-order diffracted light beams. The movable plate 20 also has a substrate having parallel flat surfaces, on one of which a reflective diffraction grating having a step difference $(\lambda/2) \times (1+2j)/n_0$ is formed. Specifically, the diffraction grating of the movable plate 20 is such that major diffracted light beams are plus and minus first-order diffracted light beams. The pitch of the diffraction grating of the movable plate 20 is p/2. Moveover, the movable plate 20 has an opening through which the light beam going out from the collimator lens 2 passes. The size of the opening of the movable plate 20 is suitably determined taking the diameter of the light beam going out from the collimator lens 2 and the like.

The operation of the optical encoder 50 having the configuration shown in FIG. 7 will be described. The light beam emitted from the light source 1 is collimated by the collimator lens 2, passes though the half mirror 8 and the opening of the movable plate 20, and is diffracted by the diffraction grating of the fixed plate 18. Since the major diffracted light beams of the diffraction grating of the fixed plate 18 are plus and minus first-order diffracted light beams, the plus and minus first-order diffracted light beams enter the movable plate 20 as light beams going out from the fixed plate 18. The plus and minus first-order diffracted light beams, which are major diffracted light beams among the light beams diffracted by the diffraction grating of the movable plate 20, are diffracted again by the diffraction grating of the fixed plate 18 so as to enter the half mirror 8. The half mirror 8 reflects the light beams going out from the fixed plate 18 allowing the light beams to enter the half mirror 8. As described above, the light-receiving portion 6 receives the plus and minus first-order diffracted light beams from the fixed plate 18, thereby generating an electric signal in accordance with the change in the light intensity.

The change in the interference intensity of the diffracted light beam due to displacement of the relative position of the fixed plate 18 and the movable plate 20 will be described. Since the pitch of the diffraction grating of the movable plate 20 is half that of the diffraction grating of the fixed plate 18 in Example 5, a diffraction angle of the plus and minus first-order diffracted light beams is double that of the diffraction grating of the fixed plate 18. Therefore, the light beams diffracted by the movable plate 20 travels in the same direction as that the light beams entering the movable plate 20 travel in. When the diffracted light beams of the movable plate 20 enter the fixed plate 18 and are diffracted, interference occurs between the two diffracted light beams.

Furthermore, when the relative position of the fixed plate 18 and the movable plate 20 changes by s, the phase change of $\pm 4\pi s/p$ occurs between the two diffracted light beams. Therefore, the intensity change of the interference light beams received at the light-receiving portion 6 is $2\{\cos(8\pi s/p)+1\}$. As a result, a signal of 4 pulses can be obtained by the relative change for 1 pitch of the diffraction grating of the fixed plate 18. Accordingly, the optical encoder 50 has high resolution as compared with the conventional optical encoder 100 shown in FIG. 13. The interference between the diffracted light beams is not affected by the distance between the movable plate 20 and the fixed plate 18. Therefore, even when the grating pitch is reduced in order to further enhance the resolution, the distance between the movable plate 20 and the fixed plate 18 can be increased. As a result, it is possible to provide higher resolution for the optical encoder 50.

As described above, according to Example 5, the fixed plate and the movable plate respectively have reflective diffraction gratings, and furthermore, the pitch of the diffraction grating of the movable plate is half that of the fixed plate. As a result, the same effects as those of Example 1 can be obtained.

Since the light source, the light-receiving portion and the movable plate are placed on the movable section, the light-receiving portion is hardly displaced even when the movable section is inclined. Thus, it is possible to reduce the area of the light-receiving portion so as to improve a response speed.

Although the diffraction gratings of the fixed plate and the movable plate have a rectangular cross-section in Example 5, the diffraction gratings can have a sine wave cross-section or a triangular cross-section.

Although both of the diffraction gratings of the movable plate and the fixed plate are both surface reflective in Example 5, at least one of them can be bottom face reflective. For example, the diffraction grating of the fixed plate may be provided on the face opposite to that facing the movable plate. This arrangement is advantageous in that dust is hardly attached to the diffraction grating face and the like since the diffraction grating of the fixed plate is placed with the diffraction grating face down.

Although the half mirror is used for separating the light beam entering the fixed plate and the light beams going out from the fixed plate in Example 5, the separation can be achieved by inclining the optical axis of the light source with respect to the normal direction of the face of the fixed plate on which the diffraction grating is formed as described in Example 1. Alternatively, the diffraction grating can be used as described in Example 2. Alternatively, the light beam entering the fixed plate from the light source and the light beams going out from the fixed plate can be separated from each other using a polarized light beam splitter and a quarter-wave plate. The direction of the optical axis of the quarter-wave plate is at an angle of 45° with the direction in which the amount of transmitted light becomes maximum when the linearly polarized light enters the polarized light beam splitter.

Although the movable section moves and the fixed plate is fixed in Example 5, the fixed plate may be moved and the movable section can be fixed instead.

Although the movable plate is fixed to the movable section in Example 5, the movable plate is not necessarily fixed to the movable section. In other words, the displacement of the relative position of the movable plate and the fixed plate can be measured instead.

EXAMPLE 6

Hereinafter, an optical encoder 60 of Example 6 of the present invention will be described with reference to FIG. 8. Example 6 differs from Example 1 in the following point. While the diffraction gratings of both fixed plate and movable plate are transmissive and a reflective film is provided for the bottom face of the fixed plate in Example 1, the diffraction gratings of the fixed plate and the movable plate are respectively reflective and transmissive and the reflective film is omitted in Example 6. Moreover, the pitch of the diffraction grating of the movable plate is double that of the diffraction grating of the fixed plate. The same components as those in FIGS. 1A, 1B and 5 are denoted by the same reference numerals.

Figure 8:
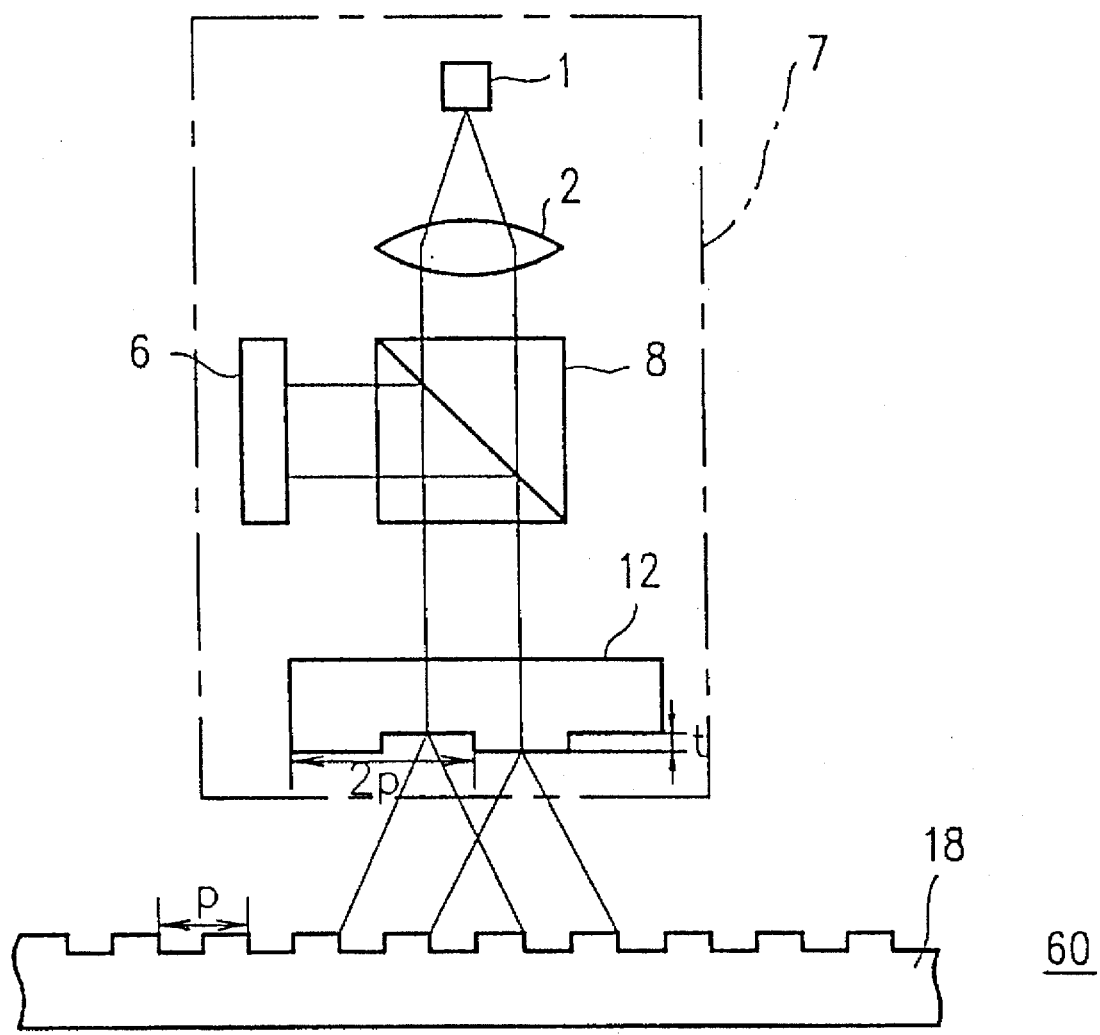
FIG. 8 is a schematic diagram showing an optical encoder of Example 6 according to the present invention.

An optical encoder 60 of FIG. 8 has the light source 1, the collimator lens 2, a movable plate 12, the half mirror 8 and the light-receiving portion 6, which are all included in the movable section 7, and the fixed plate 18. The movable plate 12 has a transparent substrate having parallel flat surfaces, on one of which a diffraction grating of a rectangular cross-section having a pitch $2p$ and a step difference $t$ satisfying the above Equation 1 is formed. Specifically, the diffraction grating of the movable plate 12 is a transmissive diffraction grating, major diffracted light beams of which are plus and minus first diffracted light beams. The fixed plate 18 has a substrate having parallel flat surfaces, on one of which is formed a reflective diffraction grating having a pitch p and a step difference $(\lambda/2) \times (1+2j)/n_0$, where j=0, 1, 2, ... and so forth. Since the step difference is thus set, the major diffracted light beams of the diffraction grating of the fixed plate 18 are plus and minus first diffracted light beams.

The operation of the optical encoder 60 having the structure shown in FIG. 8 will be described. The light beam emitted from the light source 1 is collimated by the collimator lens 2, passes though the half mirror 8, and is diffracted by the diffraction grating of the movable plate 12. The plus and minus first-order diffracted light beams, which are major diffracted light beams of the diffraction grating of the movable plate 12, enter the fixed plate 18 as light beams going out from the movable plate 12. The fixed plate 18 diffracts the light beams going out from the movable plate 12 so that the light beams reenter the movable plate 12. The light beams going out from the movable plate 12 are reflected by the half mirror 8 so as to enter the light-receiving portion 6. In this way, the light-receiving portion 6 receives the plus and minus first-order diffracted light beams from the diffraction grating of the movable plate 12, thereby generating an electric signal in accordance with the change in light intensity.

The change in the interference intensity of the diffracted light beam due to displacement of the relative position of the movable plate 12 and the fixed plate 18 will be described. A signal of 2 pulses is obtained with displacement of the diffraction grating of the fixed plate 18 for 1 pitch of the grating in Example 6. This is half that of the signal obtained in Example 1. Since the pitch of the diffraction grating of the fixed plate 18 is half that of the diffraction grating of the movable plate 12, the diffraction angle between the plus and minus first-order diffracted light beams and the fixed plate 18 is double that of the plus and minus first-order diffracted light beams with respect to the movable plate 12. Therefore, the light beams diffracted by the fixed plate 18 travel in the same direction as that of the light beams entering the movable plate 12. Therefore, the interference occurs between the two light beams diffracted by the movable plate 12. When the relative position of the fixed plate 18 and the movable plate 12 changes by s, the phase change of $\pm 2s/p$ occurs between the two diffracted light beams. Therefore, the intensity change of the interference light beams received at the light-receiving portion 6 is $2\{\cos(4\pi s/p)+1\}$. As a result, a signal of 2 pulses can be obtained by the relative change for 1 pitch of the diffraction grating of the fixed plate 18. Accordingly, the optical encoder 60 has high resolution as compared with the conventional optical encoder 100 shown in FIG. 13 with which only a signal of 1 pulse is obtained by the relative change of the movable plate and the fixed plate for 1 pitch of the slit. The interference between the diffracted light beams is not affected by the distance between the movable plate 12 and the fixed plate 18. Therefore, even when the grating pitch is reduced in order to further enhance the resolution, the distance between the movable plate 12 and the fixed plate 18 can be increased. As a result, it is possible to provide higher resolution for the optical encoder 60.

As described above, according to Example 6, the fixed plate and the movable plate respectively have the transmissive diffraction grating and the reflective diffraction grating, and furthermore, the pitch of the diffraction grating of the movable plate is double that of the fixed plate. As a result, the same effects as those of Example 1 can be obtained.

Since the light source, the light-receiving portion and the movable plate are placed on the movable section, the light-receiving portion is hardly displaced even when the movable section is inclined. Thus, it is possible to reduce the area of the light-receiving portion so as to improve a response speed.

Although the diffraction gratings of the fixed plate and the movable plate have a rectangular cross-section in Example 6, the diffraction gratings can have a sine wave cross-section or a triangular cross-section.

Although the diffraction grating on the movable plate is provided on the surface facing the fixed plate in Example 6, the diffraction grating can be provided on the surface facing the light source instead.

Although the half mirror is used for separating the light beam entering the fixed plate and the light beams going out from the fixed plate in Example 6, the optical axis of the light source can be inclined with respect to the normal direction of the face of the fixed plate on which the diffraction grating is formed as described in Example 1. Alternatively, the diffraction grating of light can be used as described in Example 2. Alternatively, the light beam entering the fixed plate from the light source and the light beam going out from the fixed plate can be separated from each other using a polarized light beam splitter and a quarter-wave plate. The direction of the optical axis of the quarter-wave plate is at an angle of 45° with the direction in which the amount of transmitted light becomes maximum when the linearly polarized light enters the polarized light beam splitter.

Although the movable section moves and the fixed plate is fixed in Example 6, the fixed plate can be moved and the movable section can be fixed instead.

Although the movable plate is fixed to the movable section in Example 6, the movable plate is not necessarily fixed to the movable section. In other words, the displacement of the relative position of the movable plate and the fixed plate can be measured instead.

EXAMPLE 7

Hereinafter, an optical encoder 70 of a seventh example according to the present invention will be described with reference to FIG. 9. Although Example 7 is similar to Example 1 in that the diffraction gratings of the fixed plate and the movable plate are both transmissive, Example 7 differs from Example 1 in that the diffraction grating of the movable plate is a blazed diffraction grating. By using the blazed diffraction grating, an unnecessary diffracted light beam can be prevented, and the light intensity at the light-receiving portion can be improved. The same components as those in FIGS. 1A, 1B and 5 are denoted by the same reference numerals.

Figure 9:
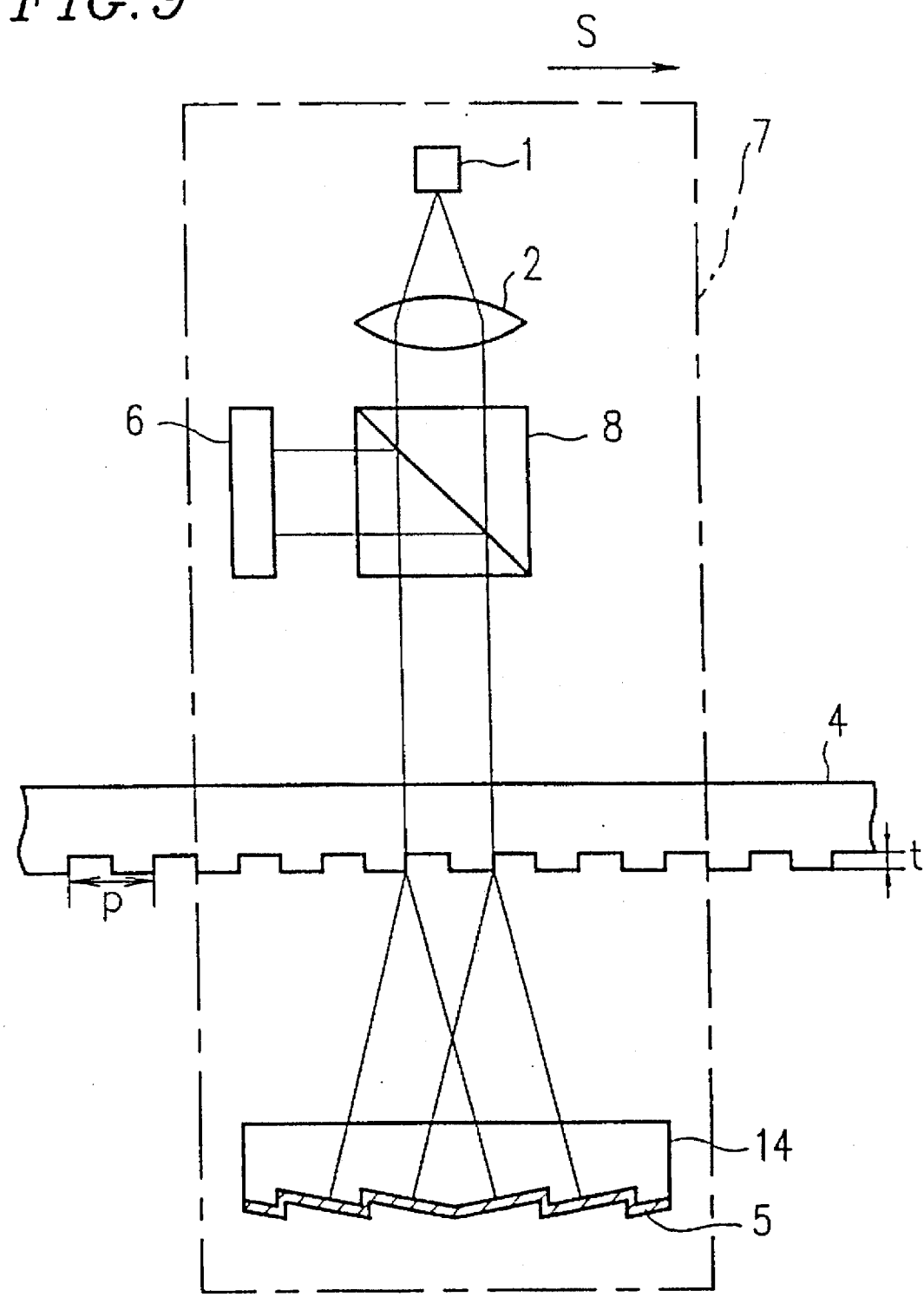
FIG. 9 is a schematic diagram showing an optical encoder of Example 7 according to the present invention.

As shown in FIG. 9, an optical encoder 70 has the light source 1, the collimator lens 2, the fixed plate 4, a movable plate 14, the reflective film 5, the half mirror 8 and the light-receiving portion 6. The components all but the fixed plate 4 are placed in the movable section 7. The fixed plate 4 is the same transparent substrate having parallel flat surfaces as that used in Example 1, on one surface of which the transmissive diffraction grating of a rectangular cross-section having a pitch p and a step difference t satisfying the above Equation 1 is formed. In Example 7, the diffraction grating of the fixed plate 4 is formed on the surface facing the movable plate 14. The movable plate 14 is a transparent substrate having parallel flat surfaces, on one surface of which the blazed diffraction grating is formed. The blazed diffraction grating is formed on the bottom face of the movable plate 14, that is, the surface of the movable plate 14 opposite to the surface facing the fixed plate 4. Moveover, the reflective film 5 is formed on the surface on which the blazed diffraction grating is formed. The pitch of the blazed diffraction grating is jp/2, where j=1, 2, 3, . . . and so forth. Assuming that a refractive index of the substrate used as the movable plate 14 is $n_2$, an angle of the grating slant of the blazed diffraction grating is $\sin^{-1}$ ($\lambda/(n_2 p)$). The normal direction of the grating slant of the diffraction grating is parallel to the direction of the plus first-order diffracted light beam or the minus first-order diffracted light beam diffracted by the fixed plate 4, respectively. The directions of the grooves of the diffraction gratings of the fixed plate 4 and the movable plate 14 are parallel to each other. The movable section 7 moves to a direction which is parallel to the fixed plate 4 and perpendicular to the grooves of the blazed diffraction grating of the fixed plate 4.

The operation of the optical encoder 70 having the configuration shown in FIG. 9 will be described.

First, it is described that two fluxes of light diffracted by the diffraction gratings of the fixed plate 4 and the movable plate 14 overlap each other regardless of the distance between the fixed plate 4 and the movable plate 14 and that the interference intensity of the two fluxes changes depending on the relative position of the fixed plate 4 and the movable plate 14. Specifically, even when the pitches of the diffraction gratings of the fixed plate 4 and the movable plate 14 are reduced, a high signal amplitude is obtained regardless of the distance between the fixed plate 4 and the movable plate 14. Therefore, it is possible to provide high resolution for the optical encoder.

Figure 10A:
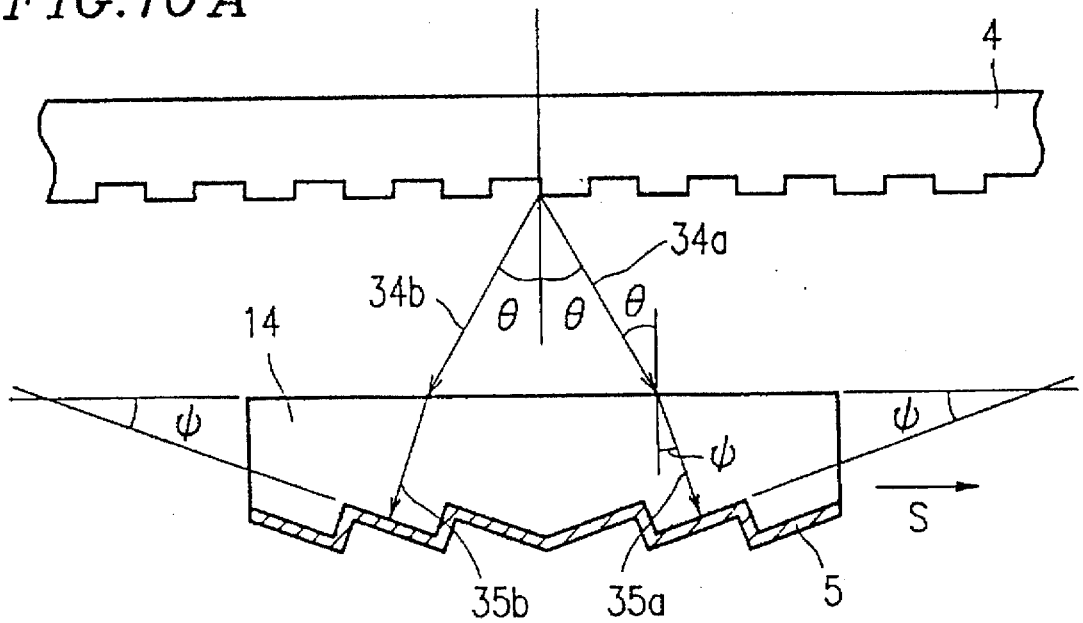
FIGS. 10A and 10B are diagrams showing optical paths to a movable plate and a fixed plate in the optical encoder shown in FIG. 9.

First, optical paths of the diffracted light beams are described with reference to FIGS. 10A and 10B. FIG. 10A shows an optical path from the fixed plate 4 to the reflective film 5 formed on the bottom face of the movable plate 14, and FIG. 10B shows an optical path from the reflective film 5 to the fixed plate 4.

The light beam emitted from the light source 1 is collimated by the collimator lens 2, passes through the half mirror 8, and enters the fixed plate 4. Since a step difference t of the diffraction grating of the fixed plate 4 satisfies the above Equation 1, the greater part of the diffracted light is concentrated in a plus first-order diffracted light beam 34a and a minus first-order diffracted light beam 34b among the light beams diffracted by the diffraction grating of the fixed plate 4. The diffraction angle of the diffracted light beams of the fixed plate 4 is $\theta = \sin^{-1}(\lambda/(n_0 p))$, where $n_0$ is a reflective index of a medium between the fixed plate 4 and the movable plate 14. The fluxes of light 34a and 34b are refracted by the surface of the movable plate 14, that is, the surface of the movable plate 14 facing the fixed plate 4 to be fluxes 35a and 35b.

Assuming that an incident angle of the fluxes of light 35a and 35b on the blazed diffraction grating is $\phi$, based on Snell's law, $\sin\phi = (n_0/n_2)\sin\theta = \lambda/(n_2 p)$. The pitch of the blazed diffraction grating of the movable plate 14 is jp/2. Therefore, assuming that a diffraction angle of the diffracted light beam is $\eta$, $0 \sin\eta = \{\lambda/(n_2 p)\} \times \{1-2k/j\}$, where k=0, ±1, ±2, ±3, . . . and so forth, and j=1, 2, 3, . . . and so forth. When k=j, the diffraction angle $\eta$ is equal to $-\phi$ and the light beams going out from the blazed diffraction grating travels in the same direction as that of the light beam incident on the blazed diffraction grating. The diffraction efficiency of the reflective blazed diffraction grating depends on the angle of the grating slant, and the greater part of the diffracted light is concentrated in a diffracted light beam which is a regular reflection with respect to the entering light beam. An angle in the normal direction of the grating slant of the blazed diffraction grating of the movable plate 14 is $\pm\sin^{-1}$ ($\lambda/(n_2 p)$), and is the same as the azimuth of the fluxes of light 35a and 35b. Thus, the greater part of the diffracted light is concentrated in diffracted light beams 36a and 36b which are reflected in the same direction. Therefore, unnecessary diffracted light beams are not generated at the movable plate 14, thereby improving the optical efficiency.

Figure 10B:
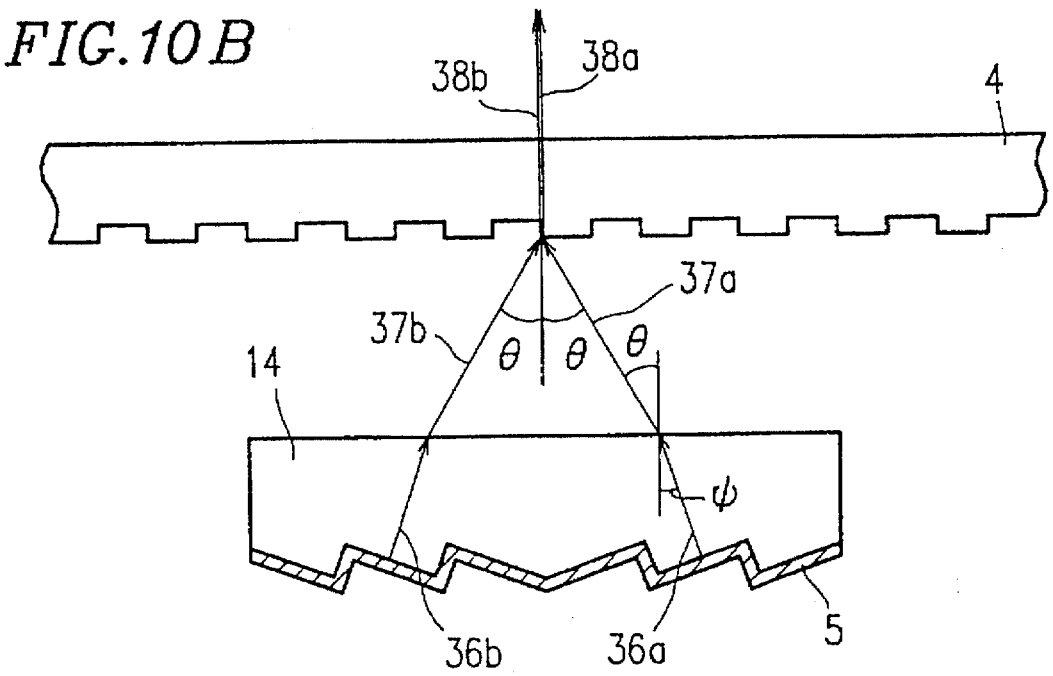

The fluxes of light 36a and 36b are refracted at the surface of the movable plate 14 as shown in FIG. 10B, enter the fixed plate 4 as fluxes of light 37a and 37b, and are diffracted there. A minus first-order diffracted light beam 38a of the flux of light 37a and a plus first-order diffracted light beam 38b of the flux 37b are parallel to and overlap each other. The fluxes of light 38a and 38b are reflected by the half mirror 8, and are directed to the light-receiving portion 6. In this way, the light-receiving portion 6 receives the plus and minus first-order diffracted light beams 38a and 38b of the fixed plate 4, thereby generating an electric signal in accordance with the change in the light intensity (that is, the change in the amount of light).

When the relative position of the fixed plate 4 and the movable plate 14 changes by s, the phase changes of $-4\pi s/p$ and $+4\pi s/p$ occur in the fluxes of light 38a and 38b, respectively. The light intensity at the light-receiving portion 6 is obtained as expressed by Equation 2 above, assuming that an amplitude of the fluxes of light 38a and 38b is 1. Therefore, it is found that an electric signal of 4 pulses can be obtained with the displacement of the movable section 7 by 1 pitch of the diffraction grating of the fixed plate 4. The interference between the diffracted light beams is not affected by the distance between the fixed plate 4 and the movable plate 14. Therefore, even when the grating pitch is reduced, the distance between the fixed plate 4 and the movable plate 14 can be increased. Thus, it is possible to enhance the resolution of the optical encoder.

As described above, according to Example 7, by using the fixed plate having the diffraction grating whose major diffracted light beams are plus and minus first-order diffracted light beams and the movable plate having the reflective blazed diffraction grating, the same effects as those in Example 1 are obtained. Furthermore, in Example 7, the use of the blazed diffraction grating improves the diffraction efficiency at the movable plate to be about doubled. Thus, an output of the light source can be lowered, resulting in the longer life of the light source.

Furthermore, since the light source, the light-receiving portion and the movable plate are placed on the movable section, the position of the fluxes of light on the light-receiving portion is hardly displaced even when the movable section is inclined. Therefore, it is possible to reduce the area of the light-receiving portion so as to improve a response speed.

Although the diffraction grating of the fixed plate has a rectangular cross-section in Example 7, the diffraction grating can have a sine wave cross-section or a triangular cross-section.

Although the diffraction grating on the movable plate is provided on the surface opposite to the surface facing the fixed plate in Example 7, the diffraction grating can be provided on the surface facing the fixed plate instead.

Although the half mirror is used for separating the light beam entering the fixed plate and the light beams going out from the fixed plate in Example 7, the optical axis of the light source can be inclined with respect to the normal direction of the surface of the fixed plate, as described in Example 1. Alternatively, the diffraction grating can be used entering the fixed plate from the light beams going out from the fixed plate as described in Example 2. Alternatively, the light beam entering the fixed plate from the light source and the light beams going out from the fixed plate can be separated from each other using a polarized light beam splitter and a quarter-wave plate. The direction of the optical axis of the quarter-wave plate is at an angle of 45° with the direction in which the amount of transmitted light becomes maximum when the linearly polarized light enters the polarized light beam splitter.

Although the movable section moves and the fixed plate is fixed in Example 7, the fixed plate may be moved and the movable section can be fixed instead.

Although the blazed diffraction grating is formed on the bottom face of the movable plate, that is, the surface opposite to the surface facing the fixed plate in Example 7, the grating can be formed on the surface facing the fixed plate. Moreover, a transmissive blazed grating can be formed on the surface facing the fixed plate, and the reflective film can be formed on the bottom face thereof instead.

EXAMPLE 8

Hereinafter, an optical encoder 80 of an eighth example according to the present invention will be described with reference to FIGS. 11, 12A and 12B. In Example 8, the reflective diffraction grating is formed on the surface of the fixed plate, which is opposite to the surface facing the movable plate, and the reflective blazed diffraction grating is formed on the surface of the movable plate, which is opposite to the surface facing the fixed plate. It is possible to prevent unnecessary diffracted light beams and to increase a signal amplitude at the light-receiving portion by using the blazed diffraction grating. Furthermore, a reflective diffraction grating provided for the fixed plate allows the movable section to be compact.

Figure 11:
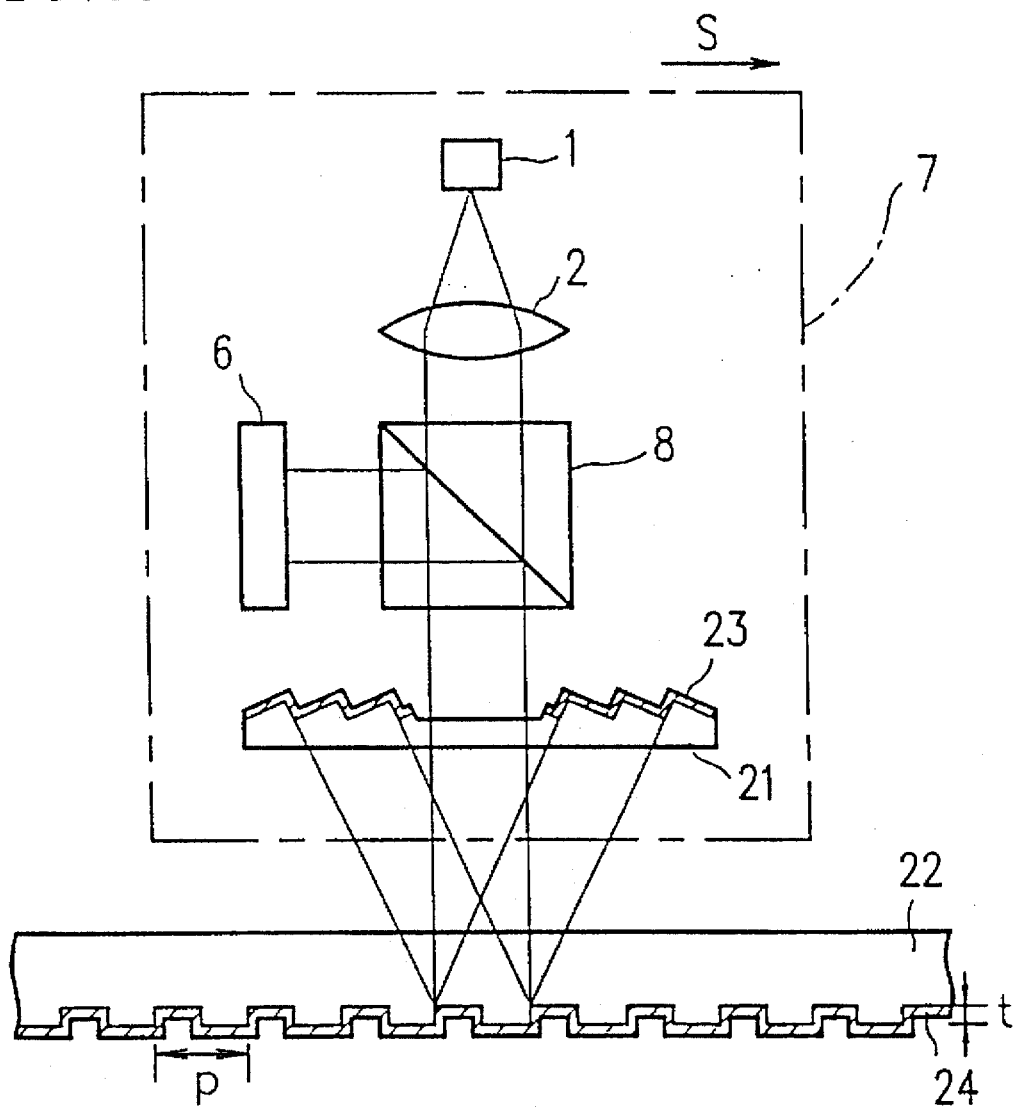
FIG. 11 is a schematic diagram showing an optical encoder of Example 8 according to the present invention.
Figure 12A:
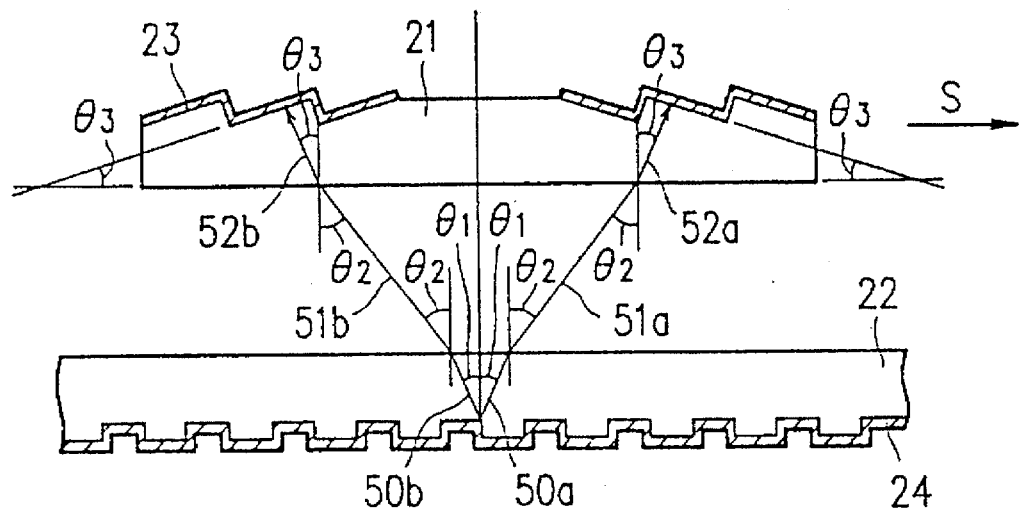
FIGS. 12A and 12B are diagrams showing optical paths to a movable plate and a fixed plate in the optical encoder shown in FIG. 11.
Figure 12B:
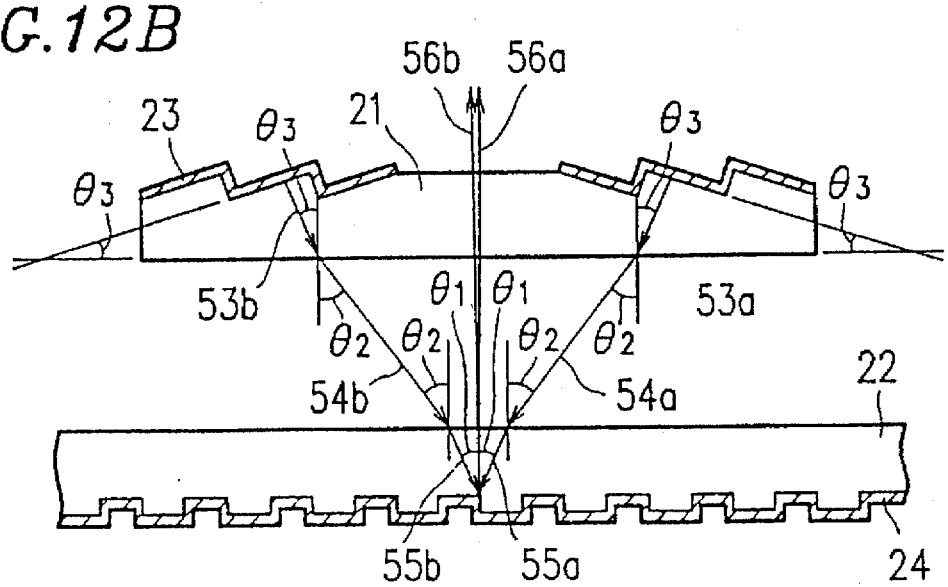

FIG. 11 schematically shows the configuration of an optical encoder 80 of Example 8. The light source 1 is a semiconductor laser, a light-emitting diode having a sufficiently small light-emitting portion or the like, which emits a light beams having a wavelength of $\lambda$. The collimator lens 2 collimates a light beam emitted from the light source 1. A fixed plate 22, which receives a collimated light beam from the collimator lens 2, has a transparent substrate having parallel flat surfaces. The diffraction grating of a rectangular cross-section having a pitch p and a step difference t is formed on the bottom face of the substrate, that is, the surface opposite to the surface facing a movable plate 21. The step difference t of the grating is set so as to satisfy the equation: $n_1 \times t = (\lambda/2) \times (1+2j)$, where $j=0, 1, 2, 3, \ldots$ and so forth, and $n_1$ is a refractive index of the material used as the fixed plate 22. Therefore, the greater part of the light beam diffracted by the diffraction grating of the fixed plate 22 is concentrated in plus and minus diffracted light beams. A reflective film 24 is formed on the surface of the fixed plate 22 on which grating is formed, as shown in FIG. 11.

The movable plate 21 also has a transparent substrate having parallel flat surfaces, on the top face of which, that is, on the surface opposite to the surface facing the fixed plate 22, the blazed diffraction grating is formed. The pitch of the blazed diffraction grating is jp/2, where $j=1, 2, 3, \ldots$ and so forth. Assuming that a refractive index of the material of the movable plate 21 is $n_2$, an angle of the grating slant of the blazed diffraction grating is $\sin^{-1}(\lambda/(n_2 p))$. The normal direction of the grating slant of the blazed diffraction grating is parallel to the direction of the plus first-order diffracted light beam or the minus first-order diffracted light beam of the fixed plate 22. The reflective film 23 is formed on the surface of the movable plate 21, on which the blazed diffraction grating is formed. The movable plate 21 has a portion on which the blazed diffraction grating and the reflective film 23 are not formed, through which the light beam going out from the collimator lens 2 passes. The direction of the grooves of grating of the fixed plate 22 is parallel to that of the grooves of grating of the movable plate 21.

The half mirror 8 separates a light beam going out from the collimator lens 2 and light beams going out from the fixed plate 22. The light beams going out from the fixed plate 22 are reflected by the half mirror 8, and are directed to the light-receiving portion 6 after passing through the movable section 21. The light-receiving portion 6 receives plus and minus first-order diffracted light beams of the diffraction grating of the fixed plate 22, which go out from the fixed plate 22, so as to convert the change in the amount of light into an electric signal. The light source 1, the collimator lens 2, the movable plate 21, the light-receiving portion 6 and the half-mirror 8 are placed in the movable section 7. The movable section 7 moves in a direction which is parallel to the fixed plate 22 and perpendicular to the grooves of the diffraction grating of the fixed plate 22.

Next, the operation of the optical encoder 80 of Example 8 will be described.

First, it is described that two fluxes of light diffracted by the diffraction gratings of the movable plate 21 and the fixed plate 22 overlap each other regardless of the distance between the movable plate 21 and the fixed plate 22 and that the interference intensity between the two fluxes changes depending on the relative position of the movable plate 21 and the fixed plate 22. Specifically, even when the pitches of the diffraction gratings of the movable plate 21 and the fixed plate 22 are reduced, a high signal amplitude can be obtained regardless of the distance between the movable plate 21 and the fixed plate 22, thereby allowing the resolution to be enhanced.

First, optical paths of the diffracted light beams to the movable plate 21 and the fixed plate 22 of the optical encoder 80 are described with reference to FIGS. 12A and 12B. FIG. 12A shows an optical path from the fixed plate 22 to the reflective film 23 formed on the surface of the movable plate 21 opposite to the surface facing the fixed plate 22, and FIG. 12B shows an optical path from the reflective film 23 to the fixed plate 22.

The light beam emitted from the light source 1 is collimated by the collimator lens 2, passes through the half mirror 8, and enters the fixed plate 22. The greater part of the diffracted light is concentrated in a plus first-order diffracted light beam 50a and a minus first-order diffracted light beam 50b. The diffraction angle $\theta_1$ of the diffracted light beams of the fixed plate 22 is $\sin^{-1}(\lambda/(n_1 p))$, where $n_1$ is a refractive of a material used as the fixed plate 22. The fluxes of light 50a and 50b are reflected when going out from the fixed plate 11 as shown in FIG. 12A, resulting in fluxes 51a and 51b. Assuming that a refractive angle of the fluxes of light 51a and 51b is $\theta_2$, based on Snell's law, $n_0 \times \sin\theta_2 = n_1 \times \sin\theta_1$ is obtained, where $n_0$ is a refractive index of a material between the movable plate 21 and the fixed plate 22. Next, the fluxes 51a and 51b are refracted when entering the movable plate 21, resulting in fluxes 52a and 52b. Assuming that a refractive angle is $\theta_3$, the fluxes 52a and 52b are incident on the blazed diffraction grating of the movable plate 21 at an angle of $\theta_3$. The incident angle $\theta_3$ is obtained as: $\theta_3 = \sin^{-1}\{\lambda/(n_2 p)\}$, based on Snell's law.

The fluxes of light 52a and 52b incident on the blazed diffraction grating at an incident angle $\theta_3$ are diffracted by the blazed diffraction grating. Assuming that a diffraction angle is $\eta$. Since the pitch of the blazed diffraction grating of the movable plate 21 is jp/2, $\sin\eta = \{\lambda/(n_2 p)\} \times \{1-2k/j\}$, where $k=0, \pm1, \pm2, \pm3, \ldots$ and so forth, and $j=1, 2, 3, \ldots$ and so forth. Assuming $j=k$, $\eta = -\theta_3$ is obtained. Therefore, the light beams going out from the blazed diffraction grating travels in the same direction as that of the light beam incident on the blazed diffraction grating of the movable plate 21. The diffraction efficiency of the blazed diffraction grating depends on the angle of the grating slant, and the greater part of the light is concentrated in a diffracted light beam which is a regular reflection with respect to the entering light beam. The normal direction of the grating slant of the blazed diffraction grating of the movable plate 21 is $\pm\sin^{-1}(\lambda/(n_2 p))$, and is parallel to the direction in which the flexes of light 52a and 52b travel. Thus, the greater part of the diffracted light is concentrated in diffracted light beams 53a and 53b travelling in the same direction as that of the fluxes of light 52a and 52b. Therefore, unnecessary diffracted light beams are not generated at the movable plate 21, thereby improving the optical efficiency. As shown in FIG. 12B, the fluxes of light 53a, 54a and 55a reverse the same optical paths as those of the fluxes of light 52a, 51a and 50a shown in FIG. 12A. The fluxes of light 53b, 54b and 55b also reverse the same optical paths as those of the fluxes of light 52b, 51b and 50b. Fluxes 55a and 55b are incident on the diffraction grating of the fixed plate 22, and are individually diffracted. A minus first diffraction grating 56a of the light beam 55a and a plus first diffraction grating 56b of the light beam 55b are parallel to each other and overlap each other. After reflected by the half mirror 8, the fluxes 56a and 56b are directed to the light-receiving portion 6 where the change in the amount of light is converted to an electric signal.

When the movable section 7 moves by the distance s, the relative position of the movable plate 21 and the fixed plate 22 changes by s. As a result, the phase changes of $-4\pi s/p$ and $+4\pi s/p$ occur in the fluxes of light 56a and 56b, respectively. The light intensity at the light-receiving portion 6 is obtained as expressed by Equation 2 above, assuming that an amplitude of the fluxes of light 56a and 56b is 1. Therefore, it is found that an electric signal of 4 pulses can be obtained with the displacement of the movable section 7 by 1 pitch of the diffraction grating of the fixed plate 22. Therefore, according to the structure of Example 8, it is possible to improve the resolution of the optical encoder as compared with the conventional optical encoder 100 shown in FIG. 13. Moreover, the interference between the diffracted light beams has nothing to do with the condition of the distance between the movable plate 21 and the fixed plate 22. Therefore, even when the grating pitch is reduced, the distance between the movable plate 21 and the fixed plate 22 can be increased. Thus, it is possible to further enhance resolution of the optical encoder.

As described above, according to Example 8, the same effects as those of Example 1 are obtained by using the fixed plate having the diffraction grating whose major diffracted light beams are plus and minus first-order diffracted light beams and the movable plate having the reflective blazed diffraction grating. Furthermore, in Example 8, since the blazed diffraction grating is used, unnecessary light beams are not generated. As a result, the diffraction efficiency improved by about double. Furthermore, by forming a reflective film on the surface of the fixed plate on which the diffraction grating is formed, the movable section can be compact. Moreover, since the diffraction gratings of the movable plate and the fixed plate are respectively formed on the surfaces opposite to the surface which receive the light beam, the diffraction efficiency is not lowered even in the case where dust, oil and the like enter the grooves of the diffraction gratings. As a result, a stable output with a large signal amplitude can be obtained. Moreover, since the facing surfaces of the fixed plate and the movable plate are flat, dust, oil or the like can be removed with ease.

Although the diffraction grating of the fixed plate has a rectangular cross-section in Example 8, the diffraction grating can have a sine wave cross-section or a triangular cross-section.

Although the half mirror is used for separating the light beam entering the fixed plate and the light beams going out from the fixed plate in Example 8, the optical axis of the light source can be inclined with respect to the normal direction of the fixed plate. Alternatively, the diffraction grating can be used for separating the light beam entering the fixed plate and the light beams going out from the fixed plate. Alternatively, the light beam entering the fixed plate and the light beams going out from the fixed plate can be separated from each other using a polarized light beam splitter and a quarter-wave plate. The direction of the optical axis of the quarter-wave plate is at an angle of 45° with the direction in which the amount of transmitted light becomes maximum when the linearly polarized light enters the polarized light beam splitter.

Although the movable section moves and the fixed plate is fixed in Example 8, the fixed plate can be moved and the movable section can be fixed instead. Neither the fixed plate nor the movable plate is necessarily fixed as long as the displacement of the relative position of the fixed plate and the movable plate can be measured.

As described above, in the optical encoder of the present invention, the movable plate and the fixed plate are respectively provided with diffraction gratings instead of conventional slits. The phase change of the diffracted light beams in accordance with the displacement of the relative position of two diffraction gratings is converted into the change in the amount of light due to the interference between the diffracted light beams. Then, the obtained change in the amount of light is detected at the light-receiving portion. In this way, with the optical encoder of the present invention, it is possible to obtain a pulse, which is a multiple of the pulse of the optical encoder using a conventional slit plate by an integer, when the relative position of the movable plate and the fixed plate changes by one pitch of the fixed plate. As a result, the position can be detected with higher precision.

The interference between the diffracted light beams is not affected by the change in the distance between the movable plate and the fixed plate. Therefore, the pitch of the diffraction gratings of the movable plate and the fixed plate is reduced in order to enhance the precision, it is possible to set the distance between the movable plate and the fixed plate so that a signal amplitude is not lowered and the movable plate and the fixed plate are not broken due to contact therebetween and the like. Moreover, the degree of freedom of measurement can be increased. Furthermore, unlike the case where Fourier images are used, the distance between the movable plate and the fixed plate is not limited. Therefore, even when the distance between the movable plate and the fixed plate is varied, an output at the light-receiving portion is hardly varied.

By using a reflective diffraction grating as at least one of diffraction gratings of the movable plate and the fixed plate, or by using transmission diffraction gratings as both of the diffraction gratings of the movable plate and the fixed plate and providing a reflective film, the optical path of the light beam diffracted by the movable plate and the fixed plate is reversed so that the light beam reenters the movable plate and the fixed plate. With this configuration, it is possible to realize the high precision while reducing the optical encoder in size.

The movable and fixed plates are easily duplicated from a stamper. Therefore, it is possible to reduce the fabrication cost of the optical encoder.

Moreover, when a blazed diffraction grating is used as a diffraction grating formed on either of the fixed plate and the movable plate, the effect that the diffraction efficiency at the blazed diffraction grating is improved to be substantially doubled is also obtained in addition to the above effects since unnecessary diffracted light beams are not generated. As the result of this, the output of the light source can be lowered, so that the lifetime of the light source can be prolonged.

Furthermore, since the light source, the light-receiving portion and the movable plate are placed on the movable section, the position of the fluxes of light on the light-receiving portion is hardly displaced. Thus, it is possible to reduce the area of the light-receiving portion so as to improve a response speed.

Furthermore, since the diffraction gratings of the movable plate and the fixed plate are formed on the faces opposite to the faces on which the light beams are incident, the diffraction efficiency is never lowered even when dust, oil and the like enter the grooves of the diffraction gratings. As a result, a stable output with a large signal amplitude can be obtained. Moreover, since the facing surfaces of the fixed plate and the movable plate are flat, dust, oil or the like can be removed with ease.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An optical encoder comprising:

a light source;

a first grating plate having a first diffraction grating for diffracting a light beam emitted from the light source;

a second grating plate having a second diffraction grating for further diffracting the light beam diffracted by the first diffraction grating so as to allow the further diffracted light beam to be incident on the first grating plate; and a light-receiving portion for receiving the further diffracted light beam from the first grating plate;

wherein a diffraction angle of plus and minus mth-order diffracted light beams of the second diffraction grating is substantially equal to a doubled diffraction angle of the plus and minus mth-order diffracted light beams of the first diffraction grating, where m is a positive integer, and the light-receiving portion generates an electric signal in accordance with the amount of the plus and minus mth-order diffracted light beams of the first diffraction grating.

2. An optical encoder according to claim 1, wherein each of the first diffraction grating and the second diffraction grating has a grating step difference which is set so that the plus and minus mth-order diffracted light beams are major diffracted light beams.

3. An optical encoder according to claim 1, wherein a grating pitch of the second diffraction grating is one-half that of the first diffraction grating.

4. An optical encoder according to claim 1, wherein the second diffraction grating is a reflective diffraction grating.

5. An optical encoder according to claim 4, wherein the first diffraction grating is a transparent type diffraction grating.

6. An optical encoder according to claim 4, wherein the second grating plate has an opening, the first diffraction grating is a reflective diffraction grating, and the light beams emitted from the light source passes through the opening of the second diffraction grating so as to be incident on the first diffraction grating.

7. An optical encoder according to claim 1, further comprising means for separating fluxes of light provided between the light source and the first grating plate.

8. An optical encoder according to claim 7, wherein the means for separating fluxes of light is a half mirror.

* * * * *